US012072395B2

(12) United States Patent
Tanaka et al.

(10) Patent No.: US 12,072,395 B2
(45) Date of Patent: Aug. 27, 2024

(54) MAGNETIC SENSOR, TORQUE SENSING DEVICE AND STEERING APPARATUS

(71) Applicant: DENSO CORPORATION, Kariya (JP)

(72) Inventors: Ken Tanaka, Kariya (JP); Toshiro Suzuki, Kariya (JP); Shigetoshi Fukaya, Kariya (JP)

(73) Assignee: DENSO CORPORATION, Kariya (JP)

( * ) Notice: Subject to any disclaimer, the term of this patent is extended or adjusted under 35 U.S.C. 154(b) by 567 days.

(21) Appl. No.: 17/408,101

(22) Filed: Aug. 20, 2021

(65) Prior Publication Data

US 2021/0380161 A1  Dec. 9, 2021

Related U.S. Application Data

(63) Continuation of application No. PCT/JP2020/006851, filed on Feb. 20, 2020.

(30) Foreign Application Priority Data

Feb. 25, 2019 (JP) ................................ 2019-031659

(51) Int. Cl.
*G01R 33/00* (2006.01)
*B62D 6/10* (2006.01)
*G01L 3/10* (2006.01)
*G01L 5/22* (2006.01)
*G01R 33/02* (2006.01)
*G01R 33/07* (2006.01)

(52) U.S. Cl.
CPC .......... *G01R 33/0047* (2013.01); *B62D 6/10* (2013.01); *G01L 3/101* (2013.01); *G01L 5/221* (2013.01); *G01R 33/0011* (2013.01); *G01R 33/02* (2013.01); *G01R 33/07* (2013.01)

(58) Field of Classification Search
CPC .......... G01R 33/0047; G01R 33/0011; G01R 33/02; G01R 33/07; B62D 6/10; G01L 3/101; G01L 5/221
See application file for complete search history.

(56) References Cited

U.S. PATENT DOCUMENTS

| 7,644,635 B2 | 1/2010 | Prudham et al. |
| 8,800,388 B2 * | 8/2014 | Takahashi ............... G01L 3/104 73/862.331 |
| 9,821,846 B2 * | 11/2017 | Schoepe .................. G01D 5/14 |

(Continued)

FOREIGN PATENT DOCUMENTS

| JP | 2009-162541 A | 7/2009 |
| JP | 4968517 B2 | 7/2012 |

(Continued)

OTHER PUBLICATIONS

U.S. Appl. No. 17/408,250, filed Aug. 20, 2021, Tanaka et al.

*Primary Examiner* — Ryan D Walsh
(74) *Attorney, Agent, or Firm* — Posz Law Group, PLC

(57) ABSTRACT

A magnetic sensor includes a magnetic sensing device, a sensor housing and a pair of magnetic flux guide members. The sensor housing includes a base body and a flange. The base body holds the magnetic sensing device at one end portion of the base body. The flange is fixed to the base body and is configured to be placed in contact with a receiving wall that receives a first magnetic circuit portion and a second magnetic circuit portion. The flange is made of a material having a higher rigidity than the base body.

10 Claims, 17 Drawing Sheets

(56) References Cited

U.S. PATENT DOCUMENTS

| | | | |
|---|---|---|---|
| 11,035,745 B2 * | 6/2021 | Tanaka | G01R 33/0011 |
| 11,255,931 B2 * | 2/2022 | Suzuki | G01L 5/221 |
| 11,353,521 B2 * | 6/2022 | Tanaka | G01R 33/0047 |
| 11,808,648 B2 * | 11/2023 | Tanaka | G01L 3/101 |
| 2008/0250873 A1 | 10/2008 | Prudham et al. | |
| 2011/0221432 A1 | 9/2011 | Oota | |
| 2012/0285266 A1 | 11/2012 | Takahashi et al. | |
| 2015/0369679 A1 | 12/2015 | Ishimoto | |
| 2016/0153849 A1 | 6/2016 | Takahashi et al. | |
| 2016/0153850 A1 | 6/2016 | Takahashi et al. | |
| 2017/0336276 A1 * | 11/2017 | Toyama | G01D 5/145 |
| 2020/0041366 A1 * | 2/2020 | Tanaka | B62D 6/10 |
| 2020/0047790 A1 | 2/2020 | Maehara | |

FOREIGN PATENT DOCUMENTS

| | | | |
|---|---|---|---|
| JP | 5153490 B2 | 2/2013 | |
| JP | 5205891 B2 | 6/2013 | |

\* cited by examiner

FLOW OF MAGNETIC FLUX

MAGNETIC FLUX RADIATION RANGE

NUMBER OF MAGNETIC POLES IN RADIATION RANGE

MAGNETIC SENSOR, TORQUE SENSING DEVICE AND STEERING APPARATUS

CROSS REFERENCE TO RELATED APPLICATIONS

This application is a continuation application of International Patent Application No. PCT/JP2020/006851 filed on Feb. 20, 2020, which designated the U.S. and claims the benefit of priority from Japanese Patent Application No. 2019-31659 filed on Feb. 25, 2019. The entire disclosures of all of the above applications are incorporated herein by reference.

TECHNICAL FIELD

The present disclosure relates to a magnetic sensor, a torque sensing device and a steering apparatus.

BACKGROUND

Previously, there has been proposed a torque sensing device that senses a torque by sensing a magnetic flux which changes in response to twisting of a torsion bar. Specifically, this torque sensing device includes magnetic circuit portions that generate the magnetic flux in response to the twisting of the torsion bar. Furthermore, the torque sensing device includes magnetic flux guide members and a magnetic sensor. The magnetic flux guide members are magnetically coupled to the magnetic circuit portions and guide the magnetic flux. The magnetic sensor includes magnetic sensing devices each of which outputs an electrical signal that corresponds to the magnetic flux guided by the magnetic flux guide members. The magnetic flux guide members are formed as separate members that are formed separately from the magnetic sensor.

SUMMARY

This section provides a general summary of the disclosure, and is not a comprehensive disclosure of its full scope or all of its features.

According to the present disclosure, there is provided a magnetic sensor configured to output an electrical signal corresponding to a magnetic flux generated between a first magnetic circuit portion and a second magnetic circuit portion which are opposed to each other. The magnetic sensor includes a magnetic sensing device, a sensor housing and a pair of magnetic flux guide members. The sensor housing includes a base body and a flange. The base body holds the magnetic sensing device at one end portion of the base body. The flange is fixed to the base body and is configured to be placed in contact with a receiving wall that receives the first magnetic circuit portion and the second magnetic circuit portion. The flange is made of a material having a higher rigidity than the base body.

Also, a torque sensing device having the above magnetic sensor as well as a steering apparatus having the torque sensing device are provided.

BRIEF DESCRIPTION OF DRAWINGS

The drawings described herein are for illustrative purposes only of selected embodiments and not all possible implementations, and are not intended to limit the scope of the present disclosure.

DETAILED DESCRIPTION

Figure 1:
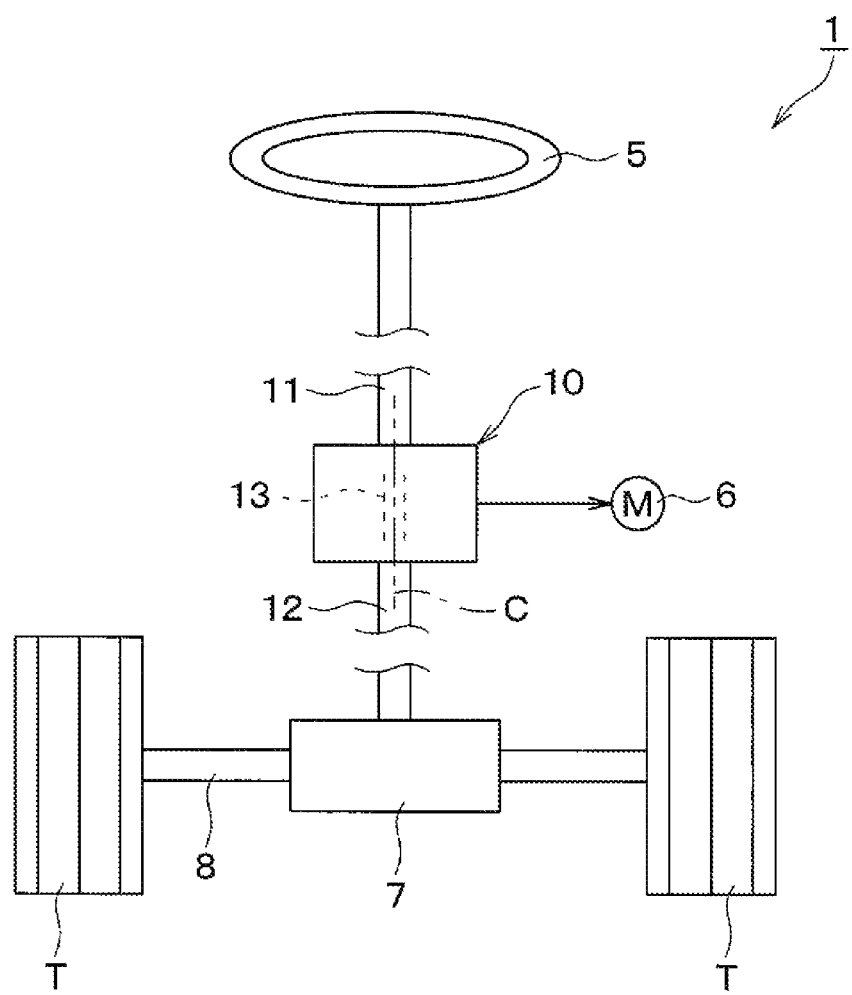
FIG. 1 is a schematic diagram showing a structure of an electric power steering apparatus having a torque sensing device according to a first embodiment.

Previously, there has been proposed a torque sensing device that senses a torque by sensing a magnetic flux which changes in response to twisting of a torsion bar. Specifically, this torque sensing device includes magnetic circuit portions that generate the magnetic flux in response to the twisting of the torsion bar. Furthermore, the torque sensing device includes magnetic flux guide members and a magnetic sensor. The magnetic flux guide members are magnetically coupled to the magnetic circuit portions and guide the magnetic flux. The magnetic sensor includes magnetic sensing devices each of which outputs an electrical signal that corresponds to the magnetic flux guided by the magnetic flux guide members. The magnetic flux guide members are formed as separate members that are formed separately from the magnetic sensor. Attachment portions of the magnetic flux guide member are installed to an opening of the magnetic sensor.

The torque sensing device is formed such that the magnetic circuit portions are received on an inner side a receiving wall that has an installation hole, and the magnetic flux guide members are installed in the installation hole such that the magnetic flux guide members are placed adjacent to the magnetic circuit portions. The magnetic sensor includes a flange that contacts the receiving wall, and the flange is made of metal. Therefore, the flange is less likely to warp upon application of heat to the flange, and thereby a gap is less likely to be formed between the flange and the receiving wall.

However, in the above torque sensing device, the magnetic sensor is provided separately from the magnetic flux guide members. Thus, at the time of assembling the magnetic sensor and the magnetic flux guide members together, variations in a positional relationship between the magnetic sensing devices and the magnetic flux guide members tend to occur, and variations in a distance between the magnetic sensing device and the magnetic flux guide member tend to occur. Therefore, variations in the sensitivity of the torque sensing device tend to occur.

According to one aspect of the present disclosure, there is provided a magnetic sensor configured to output an electrical signal corresponding to a magnetic flux generated between a first magnetic circuit portion and a second magnetic circuit portion which are opposed to each other. The magnetic sensor includes a magnetic sensing device, a sensor housing and a pair of magnetic flux guide members. The magnetic sensing device is configured to output the electrical signal which corresponds to the magnetic flux. The sensor housing includes a base body and a flange. The base body holds the magnetic sensing device at one end portion of the base body. The one end portion of the base body is configured to face the first magnetic circuit portion and the second magnetic circuit portion. The flange is fixed to the base body and is configured to be placed in contact with a receiving wall that receives the first magnetic circuit portion and the second magnetic circuit portion. The pair of magnetic flux guide members are respectively made of a soft magnetic material and are configured to guide the magnetic flux to the magnetic sensing device. The pair of magnetic flux guide members are opposed to each other while the magnetic sensing device is interposed between the pair of magnetic flux guide members. The flange is made of a material having a higher rigidity than the base body. The pair of magnetic flux guide members are held by the base body together with the magnetic sensing device.

According to this aspect, since the magnetic sensing device and the magnetic flux guide members are provided to the common sensor housing, it is possible to limit the deviation in the positional relationship between the magnetic sensing device and the magnetic flux guide members in comparison to a case where a member, which holds magnetic sensing device, and a member, which holds the magnetic flux guide members, are formed separately and are thereafter integrated together. Thus, it is possible to limit occurrence of variations in the sensitivity of the magnetic sensor.

According to another aspect of the present disclosure, there is provided a torque sensing device configured to output an electrical signal that corresponds to a torsional torque generated at a torsion bar in response to relative rotation about a rotational axis between a first shaft and a second shaft which are coaxially coupled through the torsion bar along the rotational axis. The torque sensing device includes the magnetic sensor, the first magnetic circuit portion and the second magnetic circuit portion. The first magnetic circuit portion is placed at one side of a multipole magnet in an axial direction of the rotational axis. The multipole magnet has a plurality of magnetic poles which are arranged in a circumferential direction about the rotational axis such that polarities of the plurality of magnetic poles are alternately changed in the circumferential direction. The multipole magnet is placed coaxially with the torsion bar such that the multipole magnet is rotated about the rotational axis in response to the relative rotation. The second magnetic circuit portion is placed at another side of the multipole magnet in the axial direction. The magnetic sensor is placed such that the pair of magnetic flux guide members are magnetically coupled to a magnetic circuit that is formed by the first magnetic circuit portion and the second magnetic circuit portion. The pair of magnetic flux guide members include a first magnetic flux guide member, which has a main body opposed to the first magnetic circuit portion, and a second magnetic flux guide member, which has a main body opposed to the second magnetic circuit portion. Each of the main body of the first magnetic flux guide member and the main body of the second magnetic flux guide member is configured as follows: the main body has a pair of outer end portions that are respectively placed on one circumferential side and another circumferential side of a reference line which is an imaginary line being perpendicular to the rotational axis and intersecting the main body; a distance measured between the rotational axis and the main body is set such that the distance measured at each of the pair of outer end portions is longer than the distance measured at an intermediate portion of the main body circumferentially located between the pair of outer end portions; and one or more of the plurality of magnetic poles of the multipole magnet is placed in a magnetic flux radiation range of the first shaft that is a circumferential range defined between two imaginary lines while a number of the one or more of the plurality of magnetic poles of the multipole magnet is within a predetermined range, wherein one of the two imaginary lines radially connects a radially inner side part of one of the pair of outer end portions to the rotational axis, and another one of the two imaginary lines radially connects a radially inner side part of another one of the pair of outer end portions to the rotational axis.

According to the above aspect, due to the provision of the above magnetic sensor, occurrence of variations in the sensitivity can be limited. Furthermore, the shape of the main body of each of the magnetic flux guide members is defined according to the relationship between the main body and the multipole magnet, so that influence of a noise can be reduced.

Furthermore, according to another aspect of the present disclosure, there is provided a steering apparatus to be installed to a vehicle. The steering apparatus includes the above torque sensing device and an electric motor. The electric motor is configured to output a drive force for assisting an operation of a maneuvering device operated by an occupant of the vehicle based on the electrical signal outputted from the torque sensing device.

According to this aspect, due to the provision of the above torque sensing device, it is possible to implement the steering apparatus that limits occurrence of variations in the sensitivity.

Hereinafter, embodiments of the present disclosure will be described with reference to the drawings. In each of the following embodiments, components, which are the same or equal to each other, will be described with the same reference signs.

First Embodiment

A first embodiment will be described. In the present embodiment, there will be described an example, in which a torque sensing device having a magnetic sensor is constructed, and this torque sensing device is used to construct an electric power steering apparatus of a vehicle. In the present embodiment, a so-called column-type electric power steering apparatus will be described.

The electric power steering apparatus 1 includes a steering wheel 5, an electric motor 6, a steering gear mechanism 7, two link mechanisms 8, a torque sensing device 10 and a control device (not shown). The control device of the electric power steering apparatus 1 drives the electric motor 6 in response to an operational state of the steering wheel 5 to transmit a drive force of the electric motor 6 to the steering gear mechanism 7. In this way, the electric power steering apparatus 1 assists a steering force for changing an orientation of wheels T of the vehicle through the link mechanisms 8. In the present embodiment, the steering wheel 5 corresponds to a maneuvering device that is operated by an occupant (a driver) of the vehicle.

The torque sensing device 10 is placed between the steering wheel 5 and the steering gear mechanism 7 such that the torque sensing device 10 outputs an electrical signal (e.g., a voltage) according to the operational state of the steering wheel 5. Specifically, the torque sensing device 10 is placed at a connection between a first shaft 11 and a second shaft 12. The first shaft 11 is coupled to the steering wheel 5 through a coupling mechanism (not shown) such that the first shaft 11 is rotated integrally with the steering wheel 5. The second shaft 12 is coupled to the steering gear mechanism 7 through a coupling mechanism (not shown).

Figure 2:
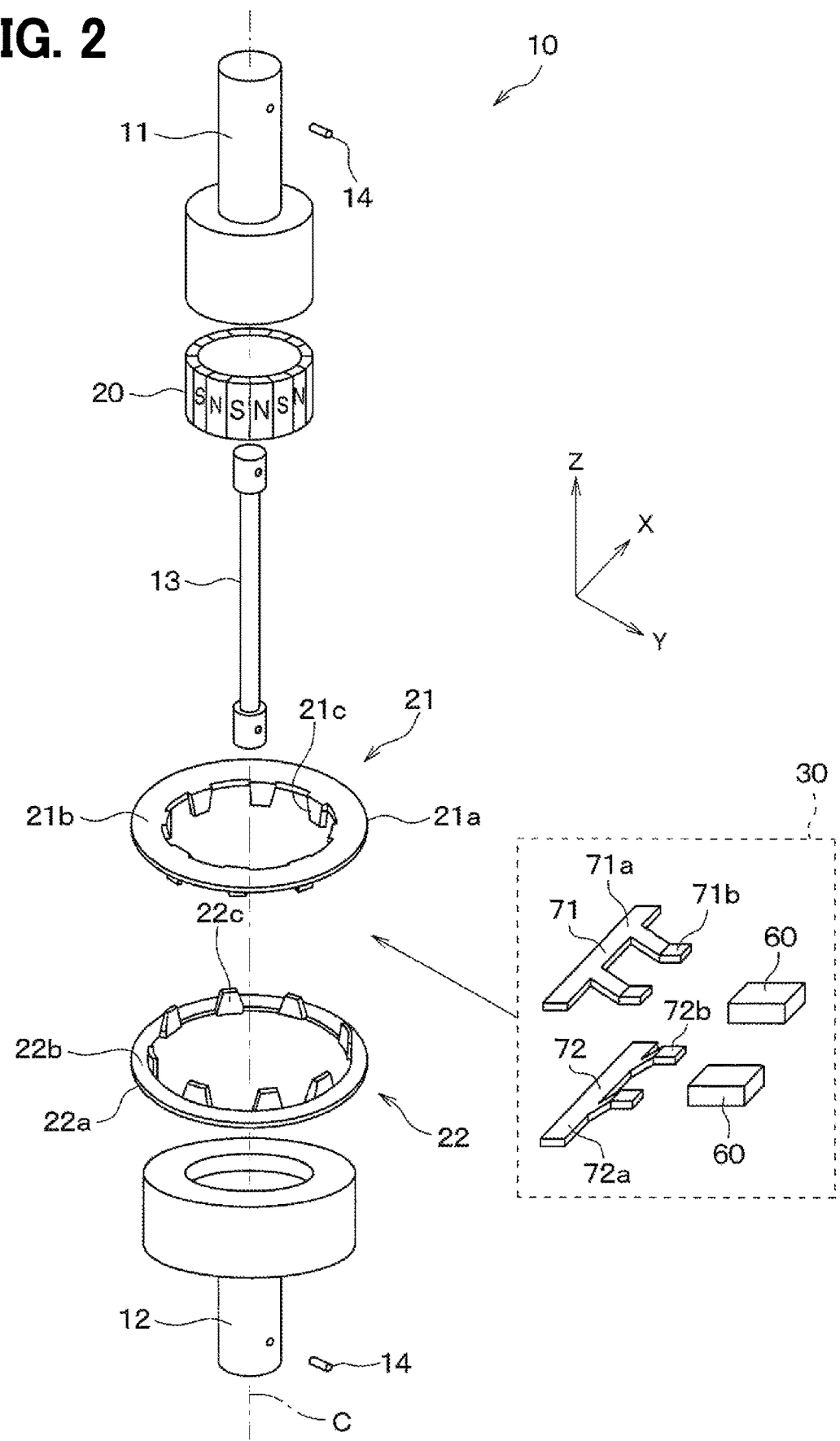
FIG. 2 is an exploded perspective view of the torque sensing device shown in FIG. 1.

The first shaft 11 and the second shaft 12 are coaxially coupled through a torsion bar 13 along the rotational axis C. The torque sensing device 10 is configured to output the electrical signal that corresponds to a torsional torque generated in torsion bar 13 in response to relative rotation about the rotational axis C between the first shaft 11 and the second shaft 12. As shown in FIG. 2 described later, the torsion bar 13 is fixed to the first shaft 11 and the second shaft 12 with fixation pins 14.

Next, a basic structure of the torque sensing device 10 of the present embodiment will be described with reference to FIG. 2. For convenience of explanation, in each of the following drawings, a right-handed XYZ Cartesian coordinate system, in which the Z-axis is parallel to the rotational axis C, is set. A direction, which is parallel to the Z-axis, is also referred to as an axial direction. Furthermore, for convenience of explanation, the Z-axis positive direction side is also referred to as an upper side, and the Z-axis negative direction side is also referred to as a lower side. In many cases, the rotational axis C is not parallel to the height direction of the vehicle.

The torque sensing device 10 includes a multipole magnet 20. The multipole magnet 20 is placed coaxially with the torsion bar 13 such that the multipole magnet 20 is rotated about the rotational axis C in response to relative rotation between the first shaft 11 and the second shaft 12. Specifically, the multipole magnet 20 is shaped in a cylindrical tubular form and is fixed to a lower end portion of the first shaft 11. The multipole magnet 20 has a plurality of magnetic poles which are arranged in a circumferential direction about the rotational axis C such that polarities of the magnetic poles are alternately changed in the circumferential direction.

The circumferential direction is typically a circumferential direction of a circle formed in the X-Y plane around an intersection where the rotational axis C intersects the X-Y plane. In the present embodiment, the multipole magnet 20 has eight N-poles and eight S-poles, i.e., a total of sixteen magnetic poles that are arranged at 22.5 degree intervals.

The first magnetic circuit portion 21 is placed at one side (i.e., an upper end side) of the multipole magnet 20 in the axial direction. The first magnetic circuit portion 21 includes a first yoke member 21a. The first yoke member 21a is shaped in a ring form and is made of a soft magnetic material. The first yoke member 21a surrounds one axial end portion (i.e., an upper end portion) of the multipole magnet 20.

Specifically, the first yoke member 21a includes a first ring plate 21b and a plurality of first-side teeth 21c. The first ring plate 21b is shaped in a flat ring form and surrounds the rotational axis C. Specifically, the first ring plate 21b has a circular opening which is centered on the rotational axis C. The first-side teeth 21c are arranged at equal intervals in the circumferential direction such that the first-side teeth 21c surround the multipole magnet 20. Each of the first-side teeth 21c extends downward in the axial direction of the rotational axis C from an inner periphery of the opening of the first ring plate 21b.

The second magnetic circuit portion 22 is placed at another side (i.e., a lower end side) of the multipole magnet 20 in the axial direction. The second magnetic circuit portion 22 includes a second yoke member 22a. The second yoke member 22a is shaped in a ring form and is made of a soft magnetic material. The second yoke member 22a surrounds another axial end portion (i.e., a lower end portion) of the multipole magnet 20.

Specifically, the second yoke member 22a includes a second ring plate 22b and a plurality of second-side teeth 22c. The second ring plate 22b is shaped in a flat ring form and surrounds the rotational axis C. Specifically, the second ring plate 22b has a circular opening which is centered on the rotational axis C. The second-side teeth 22c are arranged at equal intervals in the circumferential direction such that the second-side teeth 22c surround the multipole magnet 20. Each of the second-side teeth 22c extends upward in the axial direction of the rotational axis C from an inner periphery of the opening of the second ring plate 22b.

Figure 3:
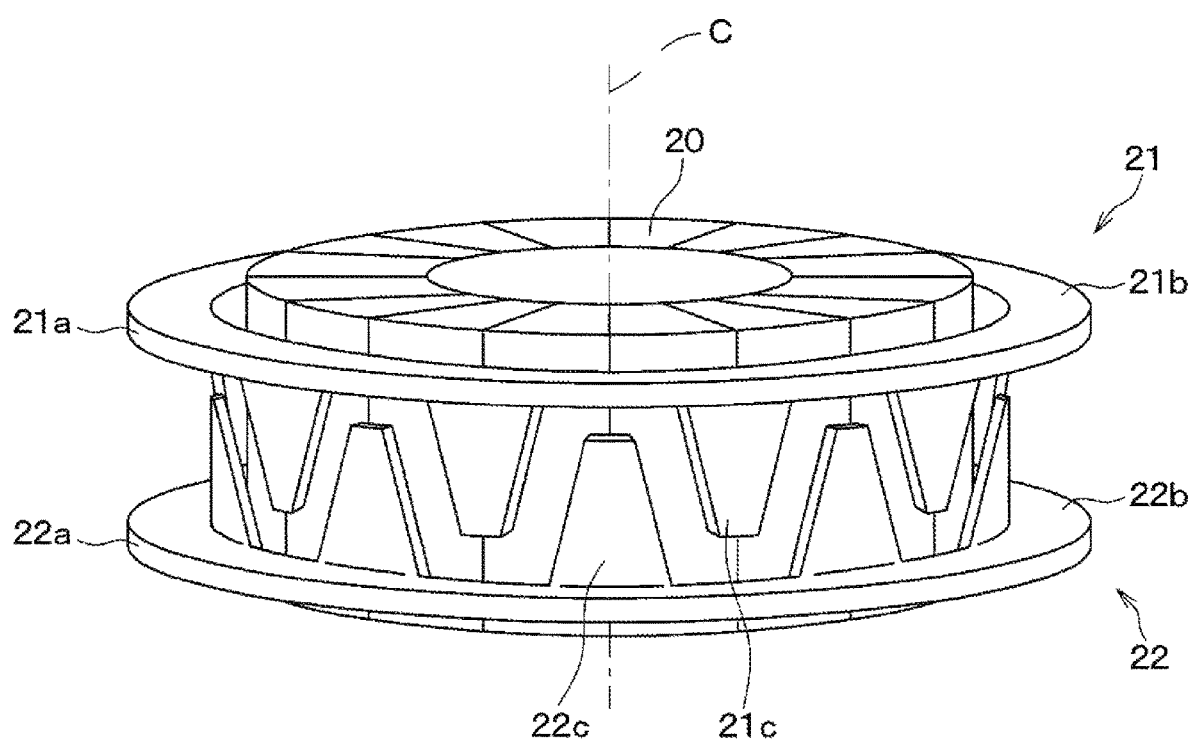
FIG. 3 is an enlarged perspective view showing a multipole magnet, a first magnetic circuit portion and a second magnetic circuit portion of the torque sensing device of FIG. 2, which are assembled together.

The first magnetic circuit portion 21 and the second magnetic circuit portion 22 are arranged in the axial direction and are opposed to each other while a predetermined gap is interposed between the first magnetic circuit portion 21 and the second magnetic circuit portion 22. Specifically, as shown in FIG. 3, the second ring plate 22b is arranged such that the second ring plate 22b opposes the first ring plate 21b in the axial direction. In other words, when the first ring plate 21b and the second ring plate 22b are viewed in the axial direction, the first ring plate 21b and the second ring plate 22b overlap with each other. The first-side teeth 21c and the second-side teeth 22c are alternately arranged in the circumferential direction. The first magnetic circuit portion 21 and the second magnetic circuit portion 22 are coupled to an upper end portion of the second shaft 12 and are rotated integrally with the second shaft 12. Therefore, the first magnetic circuit portion 21 and the second magnetic circuit portion 22 are rotatable relative to the multipole magnet 20. Thereby, the first magnetic circuit portion 21 and the second magnetic circuit portion 22 form a magnetic circuit in a magnetic field generated from the multipole magnet 20. In the present embodiment, the axial direction corresponds to an arrangement direction of the first and second magnetic circuit portions 21, 22.

Figure 4A:
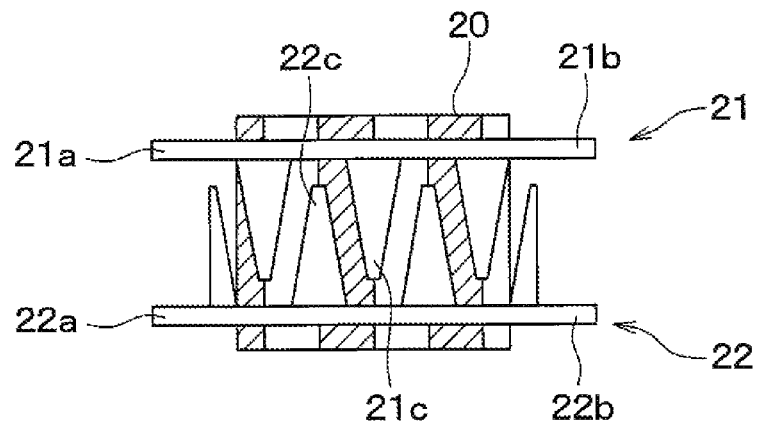
FIG. 4A is a side view showing a relative rotational state of the multipole magnet, the first magnetic circuit portion and the second magnetic circuit portion shown in FIG. 3.
Figure 4B:
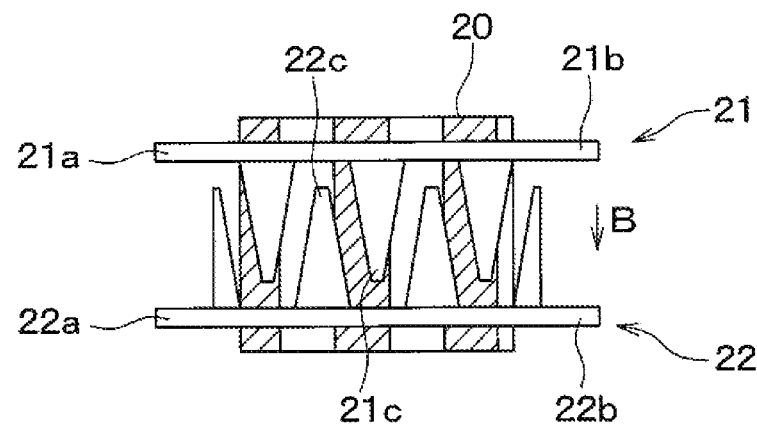
FIG. 4B is a side view showing another relative rotational state of the multipole magnet, the first magnetic circuit portion and the second magnetic circuit portion shown in FIG. 3.
Figure 4C:
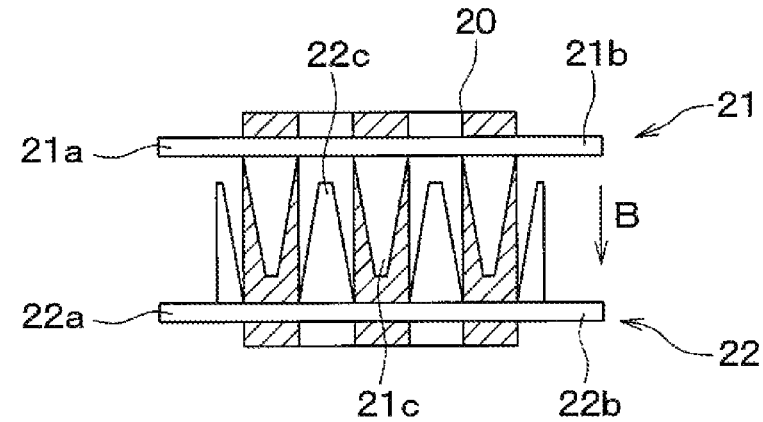
FIG. 4C is a side view showing a further relative rotational state of the multipole magnet, the first magnetic circuit portion and the second magnetic circuit portion shown in FIG. 3.

In an assembled state where a torsional torque is not applied to the torsion bar 13, the multipole magnet 20, the first magnetic circuit portion 21 and the second magnetic circuit portion 22 are phase-aligned into a neutral state in the circumferential direction, as shown in FIGS. 3 and 4A. The neutral state is a state where a circumferential center of each of the first-side teeth 21c and the second-side teeth 22c coincides with a corresponding boundary between the corresponding adjacent N-pole and the corresponding adjacent S-pole. When the torsional torque is generated at the torsion bar 13 by relative rotation between the first and second shafts 11, 12, the phase of the first and second magnetic circuit portions 21, 22 is shifted from the neutral state, as shown in FIGS. 4B and 4C. In this way, the first and second magnetic circuit portions 21, 22 generate a magnetic flux density B that corresponds to the amount of phase shift.

As shown in FIG. 2, the torque sensing device 10 is configured such that a magnetic sensor 30, which includes a pair of magnetic sensing devices 60 and first and second magnetic flux guide members 71, 72, is placed adjacent to the first magnetic circuit portion 21 and the second magnetic circuit portion 22. The magnetic sensor 30 is configured to output an electrical signal, which corresponds to a magnetic flux generated at the first and second magnetic circuit portions 21, 22, i.e., an electrical signal which corresponds to the torsional torque generated at the torsion bar 13. Hereinafter, the structure of the magnetic sensor 30 of the present embodiment will be described in detail with reference to FIGS. 5 and 6. A right-handed XYZ Cartesian coordinate system shown in FIGS. 5 and 6 corresponds to the right-handed XYZ Cartesian coordinate system shown in FIG. 2. Furthermore, depiction of a waterproof covering material 80 described later is omitted in FIG. 5 for the sake of simplicity.

Figure 5:
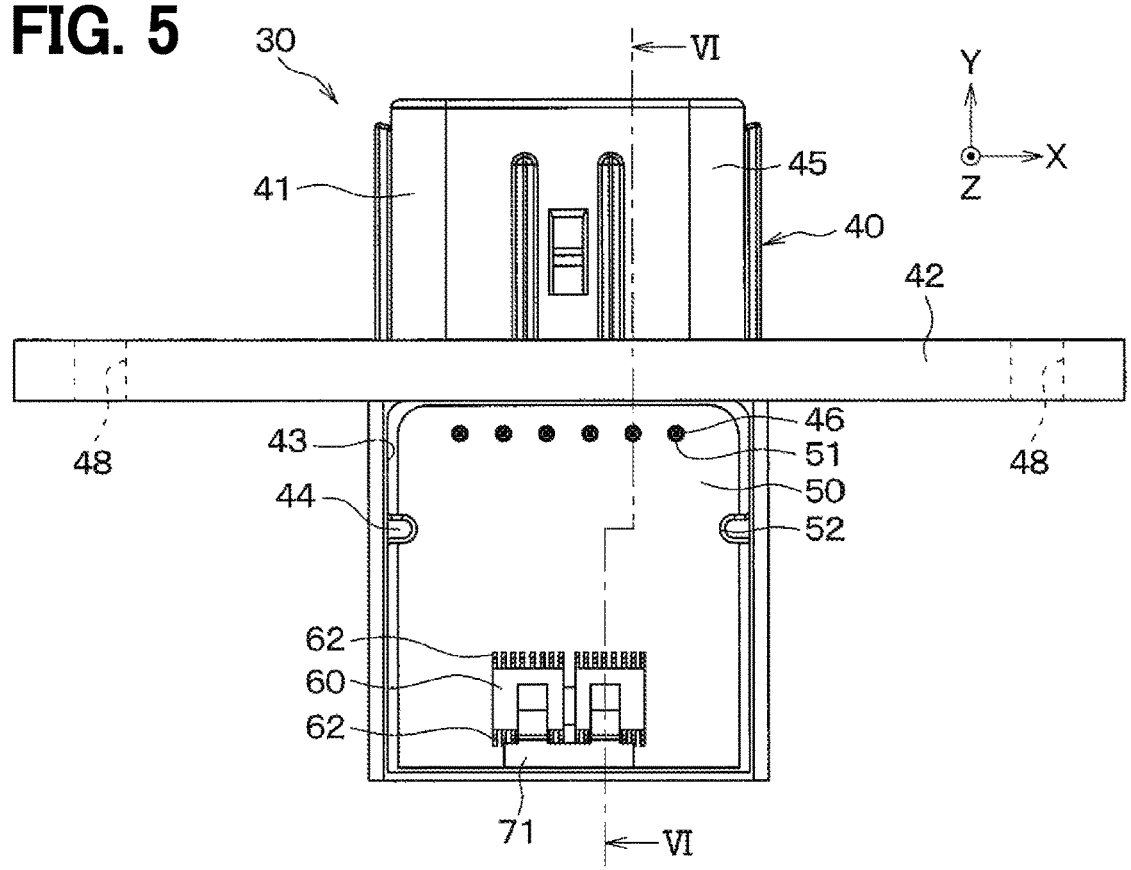
FIG. 5 is a front view of a magnetic sensor of the first embodiment.
Figure 6:
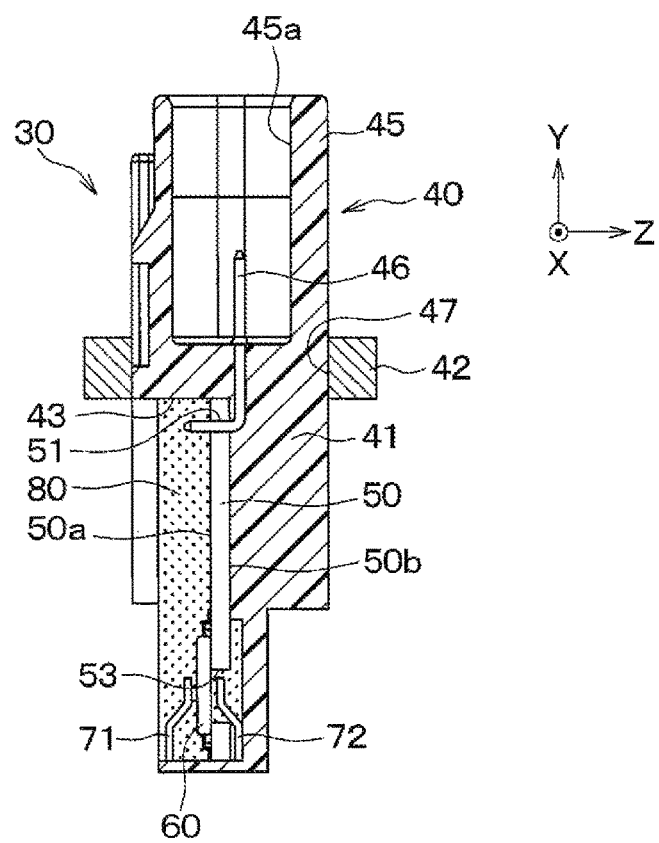
FIG. 6 is a cross-sectional view taken along line VI-VI in FIG. 5.

As shown in FIGS. 5 and 6, the magnetic sensor 30 of the present embodiment includes a sensor housing 40, a circuit board 50, the magnetic sensing devices 60 and the first and second magnetic flux guide members 71, 72.

The sensor housing 40 includes a base body 41 and a flange 42. The base body 41 is shaped in a columnar form that extends in the direction of the Y-axis. Hereinafter, a lower end of the sensor housing 40 and the base body 41 in FIG. 5 will be also referred to as one end of the sensor housing 40 and the base body 41, and an upper end of the sensor housing 40 and the base body 41 in FIG. 5 will be also referred to as the other end of the sensor housing 40 and the base body 41. Furthermore, a lower side of the sensor housing 40 and the base body 41 in FIG. 5 will be also referred to as one end portion side, and an upper side of the sensor housing 40 and the base body 41 in FIG. 5 will be also referred to as the other end portion side. That is, in FIG. 7, which will be described later, an end portion of the sensor housing 40 and the base body 41, which is closer to the first and second magnetic circuit portions 21, 22 in comparison to the other end portion of the sensor housing 40 and the base body 41 in the direction of the Y-axis, will be also referred to as the one end portion side (or one end portion), and the other end portion of the sensor housing 40 and the base body 41, which is opposite to the one end portion side, will be also referred to as the other end portion side (or the other end portion).

In the present embodiment, the base body 41 is formed by molding dielectric synthetic resin. A receiving recess 43 is formed at the one end portion of the base body 41 which is configured to face the first and second magnetic circuit portions 21, 22. The receiving recess 43 is configured to receive the circuit board 50 and has a shape that corresponds to an outer shape of the circuit board 50. In the present embodiment, as will be described later, since the circuit board 50 is shaped in a flat rectangular form, the receiving recess 43 is also shaped in a flat rectangular form. A projection 44 for positioning the circuit board 50 is formed at each of two opposed side surfaces of the receiving recess 43.

The other end portion side of the base body 41 is formed as a connector 45 that is electrically connected to an external device, and an opening 45a is formed at the connector 45. The external device may be, for example, an electronic control unit (ECU) or the like.

Further, a plurality of terminals 46 are integrated into the base body 41 by insert molding or the like. Specifically, each terminal 46 is installed in the base body 41 such that one end portion of the terminal 46 is exposed from the receiving recess 43, and the other end portion of the terminal 46 is exposed from the opening 45a. Furthermore, the one end portion of the terminal 46, which is exposed from the receiving recess 43, is inserted through a corresponding one of a plurality of insertion holes 51 formed in the circuit board 50 described later and is electrically and mechanically connected to the circuit board 50. The other end portion of the terminal 46, which is exposed from the opening 45a, is electrically connected to the external device.

The flange 42 is made of a metal material that has a higher rigidity than the base body 41. The flange 42 is shaped in a frame form and has a through-hole 47 at generally the center of the flange 42. Iron, an iron-based alloy, aluminum or an aluminum-based alloy is used as the metal material of the flange 42. The flange 42 is installed to the base body 41 such that the base body 41 passes through the through-hole 47. In the present embodiment, the flange 42 is placed on the side of the receiving recess 43 of the base body 41 where the other end portion side of the base body 41 is placed. The flange 42 may be formed integrally with the base body 41 by, for example, insert molding. Furthermore, for example, the flange 42 may be fixed to the base body 41 with adhesive or the like after the base body 41 is inserted into the through-hole 47.

Fixation holes 48 extend through an outer periphery of the flange 42 in the direction of the Y-axis.

The circuit board 50 is shaped in the flat rectangular form and has one surface 50a and the other surface 50b. Furthermore, the insertion holes 51, through which the one end portions of the terminals 46 are inserted, are formed through the circuit board 50. Furthermore, the circuit board 50 has recesses 52 which correspond to the projections 44 formed at the receiving recess 43. Furthermore, the circuit board 50 has an opening 53 into which extensions 72b of the second magnetic flux guide member 72 described later are inserted.

The magnetic sensing devices 60 are configured to output the electrical signal that corresponds to the magnetic flux of the magnetic circuit formed by the first magnetic circuit portion 21 and the second magnetic circuit portion 22. In the present embodiment, the number of the magnetic sensing devices 60 is two, and these magnetic sensing devices 60 are arranged side by side in the direction of the X-axis on the one surface 50a of the circuit board 50. In the present embodiment, by providing the two magnetic sensing devices 60 in this way, it is possible to continue the sensing of the magnetic field even if one of them becomes inoperable due to a failure or the like.

Each magnetic sensing device 60 is formed by sealing a magnetic sensitive element, such as a Hall element, at the inside of the magnetic sensing device 60 and has a main body shaped generally in a flat rectangular form and a plurality of terminals provided at the main body. A plurality of terminals 62 project outward from each of a pair of opposed side walls of the main body at the magnetic sensing device 60. Each magnetic sensing device 60 is installed to the circuit board 50 such that the main body overlaps the opening 53 when the magnetic sensing device 60 is viewed in a normal direction that is perpendicular to a plane of the circuit board 50.

The circuit board 50, on which the magnetic sensing devices 60 are installed, is placed in the receiving recess 43 of the base body 41. Specifically, the circuit board 50 is placed such that the other surface 50b is opposed to a bottom surface of the receiving recess 43, and the opening 53 is placed at the one end portion side of the sensor housing 40. Furthermore, the circuit board 50 is placed in the receiving recess 43 such that the recesses 52 are respectively fitted to the projections 44 of the receiving recess 43, and the terminals 46 are inserted through the insertion holes 51. The circuit board 50 is fixed to the receiving recess 43 by electrically and mechanically connecting the circuit board 50 with the terminals 46 by, for example, soldering. The mechanical connection strength between the circuit board 50 and the sensor housing 40 may be improved by plastically deforming the projections 44 against the circuit board 50 by, for example, heat staking.

The first magnetic flux guide member 71 and the second magnetic flux guide member 72 are made of a soft magnetic material. In the present embodiment, as shown in FIG. 2, the first magnetic flux guide member 71 includes a main body 71a and a plurality of extensions 71b. The main body 71a is shaped in a rectangular strip form that has a longitudinal direction that coincides with the direction of the X-axis. The extensions 71b extend from the main body 71a in a direction perpendicular to the longitudinal direction of the main body 71a and are bent. Similarly, the second magnetic flux guide member 72 includes a main body 72a and a plurality of extensions 72b. The main body 72a is shaped in a rectangular strip form that has a longitudinal direction that coincides with the direction of the X-axis. The extensions 72b extend from the main body 72a in a direction perpendicular to the longitudinal direction of the main body 72a and are bent.

The number of the extensions 71b, 72b of each of the first and second magnetic flux guide members 71, 72 is set to coincide with the number of the magnetic sensing devices 60. Specifically, in the present embodiment, the number of the magnetic sensing devices 60 is two, so that the number of the extensions 71b, 72b of each of the first and second magnetic flux guide members 71, 72 is set to be two.

Furthermore, in the present embodiment, the main body 71a of the first magnetic flux guide member 71 is fixed to a side surface of the receiving recess 43 by, for example, adhesive. In the first magnetic flux guide member 71, an end portion (hereinafter also referred to as a distal end portion) of each extension 71b, which is opposite from the main body 71a, is bent such that the end portion of the extension 71b is opposed to and approaches the main body of the corresponding one of the magnetic sensing devices 60.

The second magnetic flux guide member 72 is opposed to the first magnetic flux guide member 71 in the axial direction and is fixed such that the main body 72a is fixed to a bottom surface of the receiving recess 43 by, for example, adhesive. In the second magnetic flux guide member 72, an end portion (hereinafter also referred to as a distal end portion) of each extension 72b, which is opposite from the main body 72a, is bent such that the end portion of the extension 72b is opposed to and approaches the main body of the corresponding one of the magnetic sensing devices 60, and the end portion of the extension 72b is inserted into the opening 53. Specifically, the second magnetic flux guide member 72 is placed in the receiving recess 43 such that at least a portion of the second magnetic flux guide member 72 is inserted into the opening 53.

In this way, the magnetic sensor 30 is arranged such that the magnetic sensing devices 60 are placed between the first magnetic flux guide member 71 and the second magnetic flux guide member 72. That is, the magnetic sensor 30 is arranged such that the second magnetic flux guide member 72, the magnetic sensing devices 60 and the first magnetic flux guide member 71 are fixed to the common sensor housing 40. Therefore, the magnetic sensor 30 of the present embodiment can limit a deviation in the positional relationship between the magnetic sensing devices 60 and the first and second magnetic flux guide members 71, 72 in comparison to a case where a member, which holds the magnetic sensing devices 60, and a member, which holds the first and second magnetic flux guide members 71, 72, are formed separately and are thereafter integrated together.

The distal end portion of each extension 71b of the first magnetic flux guide member 71 and the distal end portion of each extension 72b of the second magnetic flux guide member 72 may be respectively spaced from the main body of the corresponding magnetic sensing device 60 or may be joined to the main body of the corresponding magnetic sensing device 60 by, for example, adhesive. Furthermore, each of the first and second magnetic flux guide members 71, 72 is arranged such that the main body 71a, 72a is placed at the one end portion side of the sensor housing 40, and the extensions 71b, 72b extend toward the other end portion side of the sensor housing 40.

The waterproof covering material 80, which integrally covers and fixes the circuit board 50, the magnetic sensing devices 60, the first magnetic flux guide member 71 and the second magnetic flux guide member 72, is arranged at the receiving recess 43. In this way, exposure of the circuit board 50 and the like to water can be limited, and a change in the positional relationship among the magnetic sensing devices 60, the first magnetic flux guide member 71 and the second magnetic flux guide member 72 can be limited. Thus, occurrence of a failure or deterioration in the sensing accuracy can be limited. The covering material 80 is made of, for example, epoxy resin.

Figure 7:
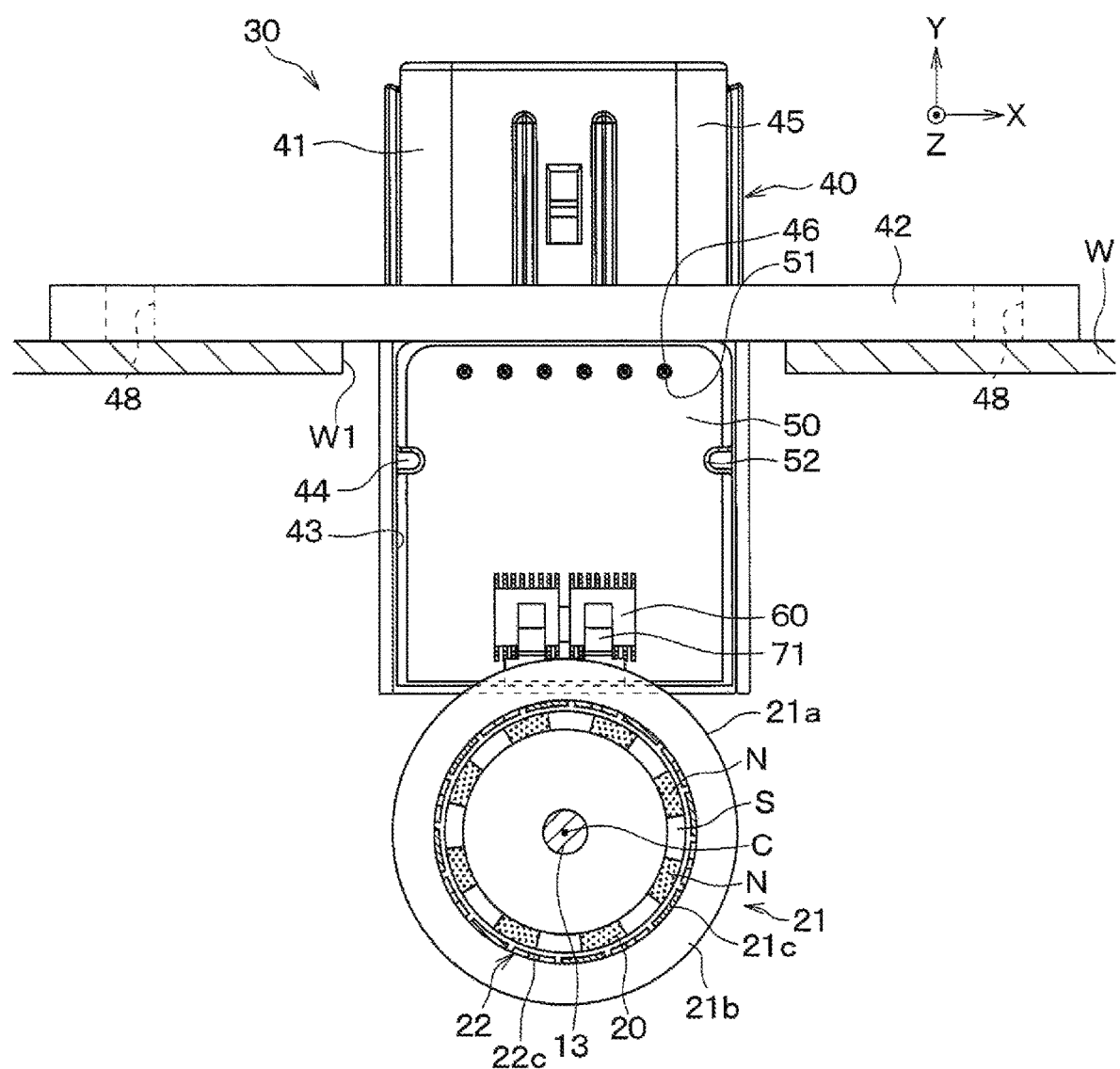
FIG. 7 is a schematic diagram of a torque sensing device where the magnetic sensor is installed to a receiving wall according to the first embodiment.

The structure of the magnetic sensor 30 of the present embodiment has been described. In the case where the magnetic sensor 30 is used in the torque sensing device 10, the one end portion of the sensor housing 40 is placed to face the first magnetic circuit portion 21 and the second magnetic circuit portion 22. Specifically, as shown in FIG. 7, the multipole magnet 20, the first magnetic circuit portion 21 and the second magnetic circuit portion 22 are received on an inner side of a receiving wall W.

In the present embodiment, the receiving wall W is a wall material that forms a casing of the electric power steering apparatus 1 shown in FIG. 1. The receiving wall W rotatably supports and covers the first shaft 11 and the second shaft 12. The receiving wall W has an installation hole W1 which is a through-hole. Furthermore, in FIG. 7, in order to avoid complication of the illustration and to facilitate understanding, the first magnetic circuit portion 21 and the second magnetic circuit portion 22 are shown in a simplified form, and the N-poles, the torsion bar 13 and the first-side teeth 21c are indicated with hatching. Further, in each corresponding drawing described later, in order to avoid complication of the illustration and to facilitate understanding, the first magnetic circuit portion 21 and the second magnetic circuit portion 22 are shown in the simplified form, and the N-poles, the torsion bar 13 and the first-side teeth 21c are indicated with hatching.

The magnetic sensor 30 is fixed to the receiving wall W such that the one end portion side of the sensor housing 40 is inserted into the inside of the receiving wall W through the installation hole W1. Specifically, the magnetic sensor 30 is arranged such that a lower end surface of the flange 42 contacts an outer wall surface (an upper surface in FIG. 7) of the receiving wall W which is located around the installation hole W1. The lower end surface of the flange 42 is a surface of the flange 42 located on the side where the one end portion side of the sensor housing 40 is placed. The magnetic sensor 30 is fixed to the receiving wall W when the magnetic sensor 30 is fixed to the receiving wall W with, for example, bolts (not shown) installed through the fixation holes 48.

Furthermore, the magnetic sensor 30 is arranged such that the first magnetic flux guide member 71 is magnetically coupled to the first magnetic circuit portion 21, and the second magnetic flux guide member 72 is magnetically coupled to the second magnetic circuit portion 22. In the present embodiment, the magnetic sensor 30 is arranged such that the first magnetic flux guide member 71 is opposed to the first magnetic circuit portion 21 in the axial direction, and the second magnetic flux guide member 72 is opposed to the second magnetic circuit portion 22 in the axial direction.

As described above, when the torsional torque is generated at the torsion bar 13, a magnetic flux, which corresponds to this torsional torque, is generated between the first and second magnetic circuit portions 21, 22. This magnetic flux is guided to the magnetic sensing devices 60 through the first and second magnetic flux guide members 71, 72. Therefore, an electrical signal, which corresponds to this magnetic flux, is outputted from the magnetic sensing devices 60.

At this time, the flange 42 is made of the metal, more specifically is made of the metal material that has the higher rigidity than the base body 41. Therefore, in comparison to a case where the flange 42 is made of a resin material that is the same as a resin material of the base body 41, warping of the flange 42 can be limited. Thus, it is possible to limit a deterioration in the degree of close contact between the flange 42 and the receiving wall W. In the case where the flange 42 is made of the iron or the iron-based alloy, the flange 42 can provide an advantage as a magnetic shield that limits transmission of an external magnetic field to the magnetic sensing device 60.

Here, in the torque sensing device 10 described above, when the multipole magnet 20 and the first and second magnetic circuit portions 21, 22 are rotated synchronously, the magnetic flux, which passes the magnetic circuit, periodically fluctuates. This periodic fluctuation becomes a noise against the electrical signal outputted from the magnetic sensing device 60. Hereinafter, the noise, which periodically changes, will be referred to as a whirl noise, and this whirl noise will be described.

A flow of the magnetic flux from the first-side teeth 21c to the first ring plate 21b at the first magnetic circuit portion 21 will be described with reference to FIG. 8. Since a flow of the magnetic flux from the second-side teeth 22c to the second ring plate 22b at the second magnetic circuit portion 22 is the same as that of the first magnetic circuit portion 21, the detailed description of the flow of the magnetic flux from the second-side teeth 22c to the second ring plate 22b at the second magnetic circuit portion 22 will be omitted.

Figure 8:
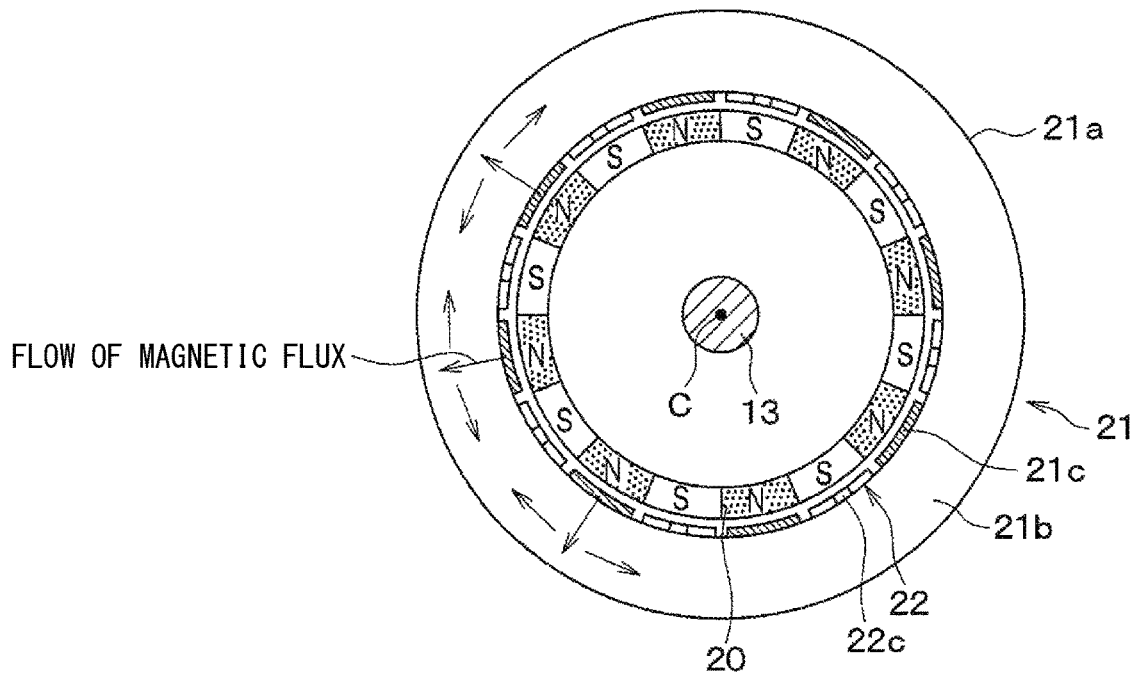
FIG. 8 is a diagram for describing a flow of a magnetic flux from first-side teeth to a first ring plate according to the first embodiment.

As shown in FIG. 8, a magnetic flux density changes according to a distance between the multipole magnet 20, which serves as a magnetic flux source, and the first-side teeth 21c of the first magnetic circuit portion 21, which faces the multipole magnet 20. The magnetic flux density at the first magnetic circuit portion 21 becomes high at a location near the first-side teeth 21c and becomes low at a location remote from the first-side teeth 21c.

Therefore, in the case where the multipole magnet 20 and the first magnetic circuit portion 21 are rotated synchronously, when the magnetic sensing device 60 is opposed to a specific part of the first ring plate 21b at the first magnetic circuit portion 21, the fluctuation of the magnetic flux generated in response to the rotation is sensed by the magnetic sensing device 60. Furthermore, in response to the rotation, the leaked magnetic flux, which is leaked between the first-side teeth 21c and the second-side teeth 22c, is added, so that the fluctuation of the magnetic flux becomes large. This is sensed by the magnetic sensing device 60 as the whirl noise. When the signal, which is sensed by the magnetic sensing device 60, becomes relatively large, an SN ratio, which is a ratio between the signal and the noise, is reduced.

Figure 9:
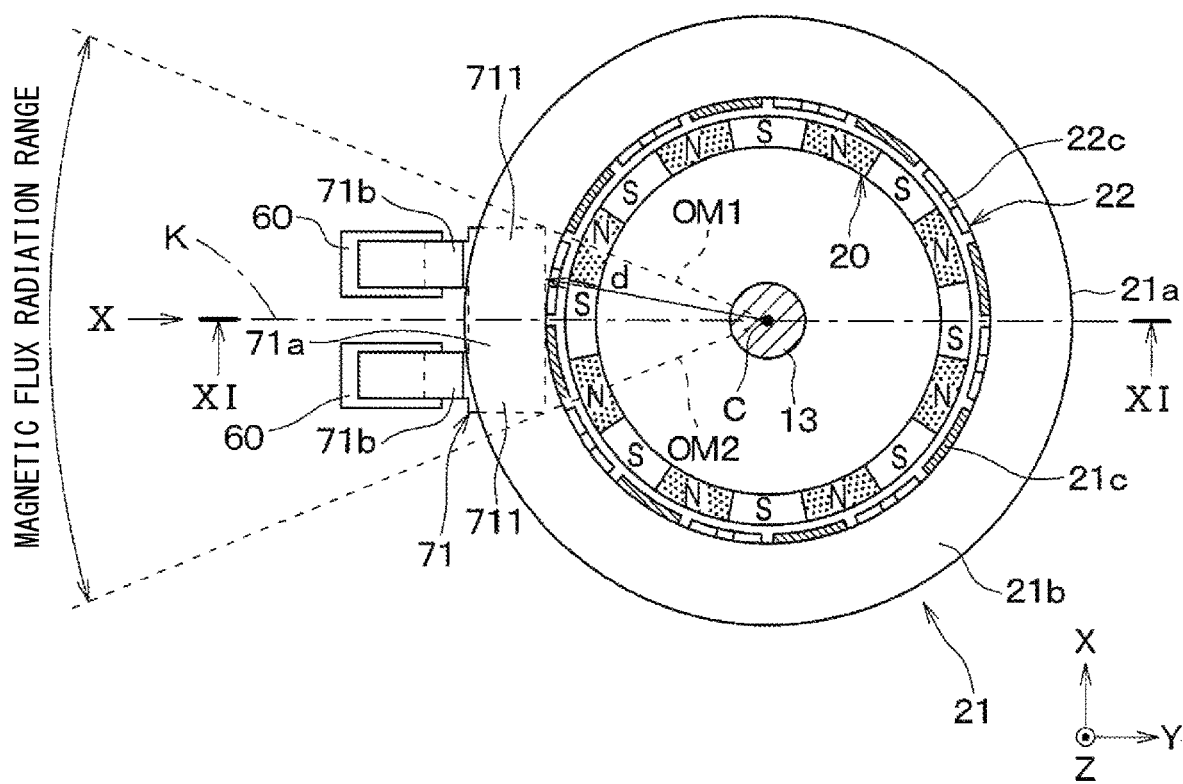
FIG. 9 is a diagram indicating a positional relationship between a first magnetic flux guide member and a first magnetic circuit portion according to the first embodiment.
Figure 10:
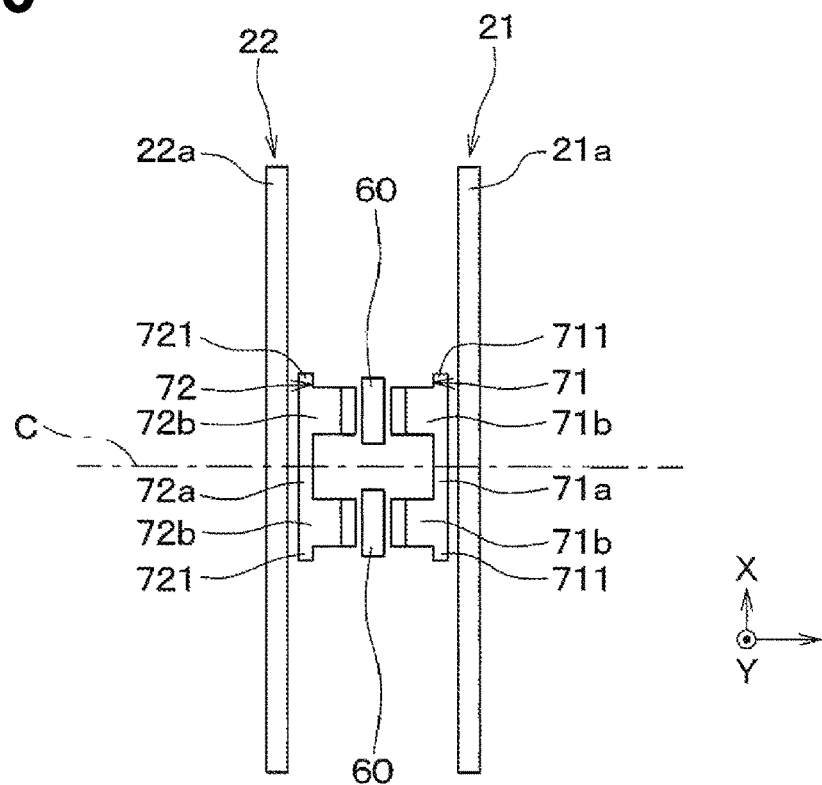
FIG. 10 is a plan view seen in a direction X in FIG. 9.
Figure 11:
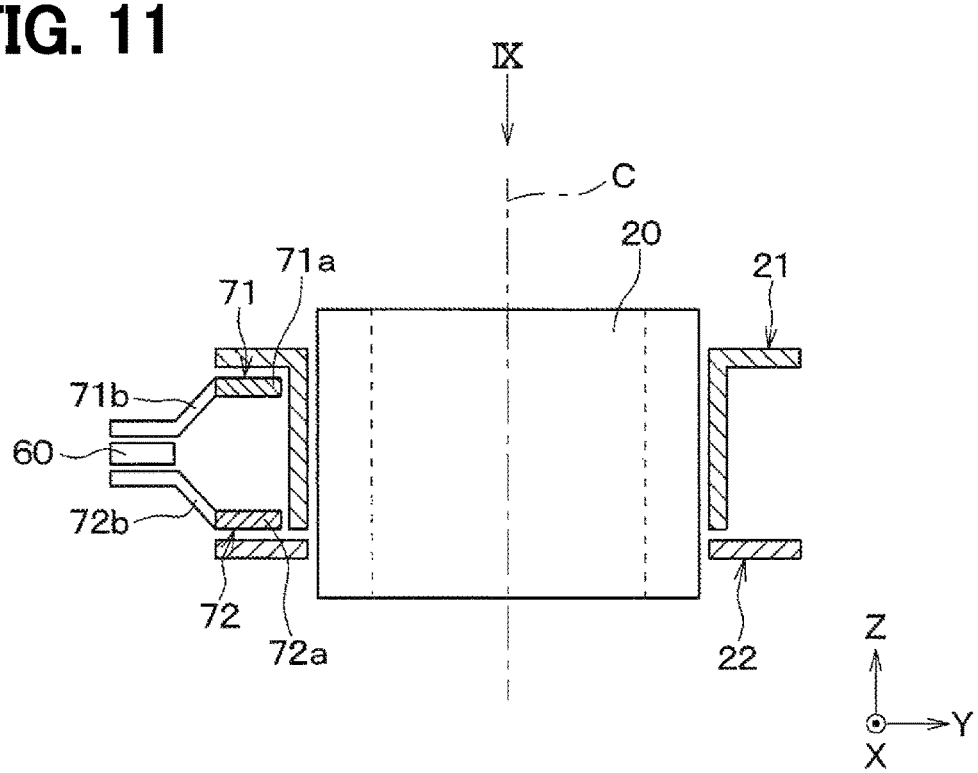
FIG. 11 is a cross-sectional view taken along line XI-XI in FIG. 9.

Therefore, in the present embodiment, the SN ratio can be improved by limiting the whirl noise. Hereinafter, a specific structure, which improves the SN ratio, will be described with reference to FIGS. 9 to 11. FIG. 9 corresponds to a plan view seen in a direction IX in FIG. 11. Furthermore, FIG. 9 shows a neutral state where a torsional displacement is not applied to the torsion bar 13. Each of the drawings, which correspond to FIG. 9 and described later, shows the neutral state where the torsional displacement is not applied to the torsion bar 13.

First of all, in each of the first and second magnetic flux guide members 71, 72 of the present embodiment, the main body 71a, 72a is shaped in the rectangular strip form, as described above. As shown in FIG. 9, in the state where the magnetic sensor 30 is installed to the receiving wall W, in the axial view, an imaginary line, which is perpendicular to the rotational axis C and intersects the center location of the main body 71a, 72a of each of the first and second magnetic flux guide members 71, 72, is defined as a reference line K. More specifically, in the axial view, the imaginary line, which is perpendicular to the rotational axis C and intersects the center location between the two magnetic sensing devices 60, is defined as the reference line K. The first and second magnetic flux guide members 71, 72 are arranged such that two opposed long sides of each of the first and second magnetic flux guide members 71, 72 extend perpendicular to the reference line K.

Furthermore, the extensions 71b, 72b of each of the first and second magnetic flux guide members 71, 72 are arranged symmetrically with respect to the reference line K. Therefore, the two magnetic sensing devices 60, each of which is placed between the corresponding two of the extensions 71b, 72b, are also arranged symmetrically with respect to the reference line K. Thus, the magnetic flux is also guided from the first and second magnetic flux guide members 71, 72 to each of the magnetic sensing devices 60.

As described above, each of the first and second magnetic flux guide members 71, 72 is arranged such that the main body 71a, 72a is placed at the one end portion side of the sensor housing 40, and the extensions 71b, 72b extend toward the other end portion side of the sensor housing 40. Therefore, in the state where the magnetic sensor 30 is installed to the receiving wall W, the extensions 71b, 72b extend in a radial direction (hereinafter also simply referred to as the radial direction) at the first and second magnetic circuit portions 21, 22.

Furthermore, in the first magnetic flux guide member 71, a pair of end portions of the main body 71a, between which the reference line K is interposed, will be referred to as a pair of outer end portions 711. Similarly, in the second magnetic flux guide member 72, a pair of end portions of the main body 72a, between which the reference line K is interposed, will be referred to as a pair of outer end portions 721. Furthermore, the outer end portions 711, 721 of each of the first and second magnetic flux guide members 71, 72 can be also said to be two circumferential end portions of the main body 71a, 72a in the circumferential direction of the first and second magnetic circuit portions 21, 22. Furthermore, the first magnetic flux guide member 71 and the second magnetic flux guide member 72 are identically formed and are arranged symmetrically with respect to an imaginary plane that extends through the two magnetic sensing devices 60.

In the present embodiment, the main body 71a, 72a of each of the first and second magnetic flux guide members 71, 72 is shaped in the rectangular strip form. Therefore, a distance d measured between the main body 71a, 72a and the rotational axis C is set such that the distance d measured at each of the pair of outer end portions 711, 721 is longer than the distanced measured at an intermediate portion of the main body 71a, 72a circumferentially located between the pair of outer end portions 711, 721.

In the axial view, an imaginary line, which radially connects a radially inner side part (the rotational axis C side part) of one of the pair of outer end portions 711, 721 to the rotational axis C, will be referred to as an imaginary line OM1, and an imaginary line, which radially connects a radially inner side part (the rotational axis C side part) of the other one of the pair of outer end portions 711, 721 to the rotational axis C, will be referred to as an imaginary line OM2. More specifically, a radially inner side part (the rotational axis C side part) of an end of the one outer end portion 711, which is circumferentially opposite to the reference line K, is connected to the rotational axis C by the imaginary line OM1, and a radially inner side part (the rotational axis C side part) of an end of the other outer end portion 711, which is circumferentially opposite to the reference line K, is connected to the rotational axis C by the imaginary line OM2. A circumferential range, which is defined between the two imaginary lines OM1, OM2 in the circumferential direction (i.e., the circumferential direction of the first shaft 11), is defined as a magnetic flux radiation range (or simply referred to as a radiation range), and one or more of the magnetic poles of the multipole magnet 20 is placed in the magnetic flux radiation range. The number of the one or more of the magnetic poles placed in the multipole magnet 20 will be referred to as the number of magnetic poles in the radiation range. In this case, in the example shown in FIG. 9, the number of magnetic poles in the radiation range is 2.0.

Figure 12:
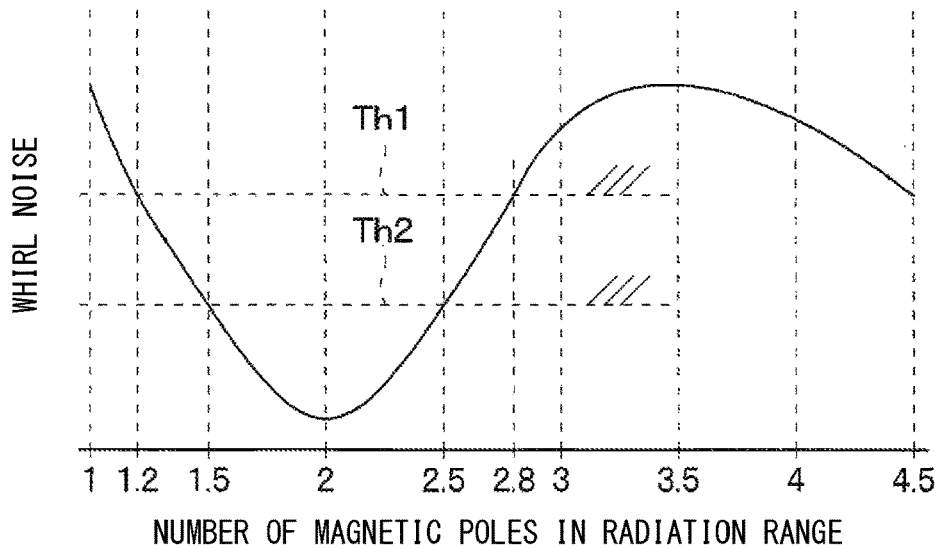
FIG. 12 is a diagram indicating a result of a simulation with respect a relationship between the number of magnetic poles of the multipole magnet in a magnetic flux radiation range and a whirl noise in a case where the total number of the magnetic poles of the multipole magnet is 16.

The inventors of the present application have studied a relationship between the number of magnetic poles in the radiation range and the whirl noise and have obtained a simulation result shown in FIG. 12. Specifically, as shown in FIG. 12, it is confirmed that the whirl noise decreases as the number of magnetic poles in the radiation range increases from 1.0, and the whirl noise becomes minimum when the number of magnetic poles is about 2.0. It is also confirmed that the whirl noise increases as the number of magnetic poles in the radiation range increases from 2.0 to 3.0.

In this case, a permissible threshold value of the whirl noise is set to Th1, and the whirl noise is below the permissible threshold value Th1 when the number of magnetic poles in the radiation range is in a range of 1.2 to 2.8. Here, it is assumed that the permissible threshold value Th1 is 300 pT which is permissible as a general whirl noise. Therefore, it is desirable that the first and second magnetic flux guide members 71, 72 are configured to have the number of magnetic poles in the radiation range in the range of 1.2 to 2.8.

Furthermore, in a case where the permissible threshold value of the whirl noise is set to Th2 that is lower than Th1, the whirl noise becomes below the permissible threshold value Th2 when the number of magnetic poles in the radiation range is in a range of 1.5 to 2.5. Here, it is assumed that the permissible threshold value Th2 is 170 pT which is recognized as a sufficiently low whirl noise in general. Therefore, in the range where the number of magnetic poles in the radiation range is 1.5 to 2.5, the effect of reducing the whirl noise can be further increased. Particularly, when the number of magnetic poles in the radiation range is 2.0, the effect of reducing the whirl noise can be maximized.

Therefore, in the present embodiment, the first and second magnetic flux guide members 71, 72 are configured to have the number of magnetic poles in the radiation range in the range of 1.2 to 2.8. It is further preferred that the first and second magnetic flux guide members 71, 72 are configured to have the number of magnetic poles in the radiation range in the range of 1.5 to 2.5.

As described above, in the present embodiment, the flange 42 is made of the material that has the higher rigidity than the base body 41. Therefore, when the magnetic sensor 30 is fixed to the receiving wall W, the flange 42 is less likely to warp in comparison to a case where the flange 42 and the base body 41 are made of a common material. Therefore, it is possible to limit the change in the positional relationship between the first and second magnetic circuit portions 21, 22 and the first and second magnetic flux guide members 71, 72 of the magnetic sensor 30, and thereby it is possible to limit the deterioration in the sensing accuracy. In the case where the flange 42 is made of the iron or the iron-based alloy, the flange 42 can also provide an advantage as a magnetic shield that limits transmission of an external magnetic field to the magnetic sensing device 60.

Furthermore, in the magnetic sensor 30, the magnetic sensing devices 60 and the first and second magnetic flux guide members 71, 72 are held by the common sensor housing 40. Therefore, it is possible to limit the deviation in the positional relationship between the magnetic sensing devices 60 and the first and second magnetic flux guide members 71, 72 in comparison to the case where the member, which holds the magnetic sensing devices 60, and the member, which holds the first and second magnetic flux guide members 71, 72, are formed separately and are thereafter integrated together. Thus, variations in the sensitivity of the magnetic sensor 30 can be limited.

Furthermore, in the present embodiment, the circuit board 50 has the opening 53, and the second magnetic flux guide member 72 is placed in the opening 53. Therefore, the magnetic sensing devices 60 can be placed in close proximity to the second magnetic flux guide member 72, and thereby the sensing accuracy can be improved.

Figure 13:
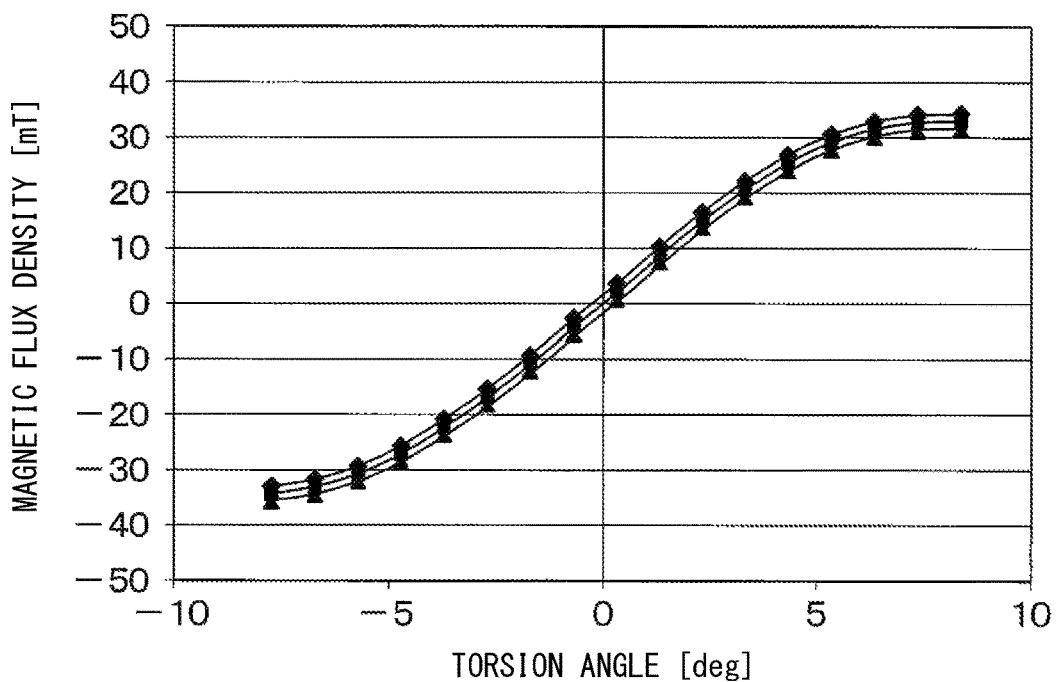
FIG. 13 is a diagram indicating a result of a simulation with respect a relationship between a torsion angle of a torsion bar and a magnetic flux density of a magnetic flux passing through a magnetic sensing device.

Furthermore, each of the first and second magnetic flux guide members 71, 72 is formed such that the extensions 71b, 72b are provided to the main body 71a, 72a, which has the pair of outer end portions 711, 721. Therefore, in comparison to an ordinary device where each of the first and second magnetic flux guide members 71, 72 are shaped in an annular form, it is possible to reduce the amount of material of the first and second magnetic flux guide members 71, 72. In this case, according to the study of the inventors of the present application, as shown in FIG. 13, it is found that the density of the magnetic flux, which is guided by the first and second magnetic flux guide members 71, 72, does not substantially change even when the size of the first and second magnetic flux guide members 71, 72 is changed. Furthermore, "a magnetic flux guide member having ½ length main body" shown in FIG. 13 is a magnetic flux guide member, in which a length of the main body 71a, 72a measured in the longitudinal direction is set to ½ of a circumferential length of an annular magnetic flux guide member. Similarly, "a magnetic flux guide member having ⅓ length main body" shown in FIG. 13 is a magnetic flux guide member, in which a length of the main body 71a, 72a measured in the longitudinal direction is set to ⅓ of the circumferential length of the annular magnetic flux guide member.

In the case where the first and second magnetic flux guide members 71, 72 is shaped in the annular form, the first and second magnetic flux guide members 71, 72 extend all around the second shaft 12 in the circumferential direction. However, in the present embodiment, since the first and second magnetic flux guide members 71, 72 are not shaped in the annular form, the first and second magnetic flux guide members 71, 72 do not extend all around the second shaft 12 in the circumferential direction. Therefore, it is not necessary to consider the second shaft 12 at the time of attaching and detaching the first and second magnetic flux guide members 71, 72, and thereby the replacement of the components can be easily performed.

The first and second magnetic flux guide members 71, 72 are configured to have the corresponding number of magnetic poles in the radiation range which allows the reduction in the whirl noise. Therefore, the whirl noise can be reduced, and the SN ratio of the magnetic sensing device 60 can be improved.

Furthermore, the sensor housing 40 is provided with the waterproof covering material 80, which integrally seals the circuit board 50, the magnetic sensing devices 60 and the first and second magnetic flux guide members 71, 72. Therefore, it is possible to improve the waterproof performance for protecting these components from the water.

(Modifications of First Embodiment)

Modifications of the first embodiment will now be described. In the first embodiment, the location of the flange 42 can be appropriately changed.

Figure 14:
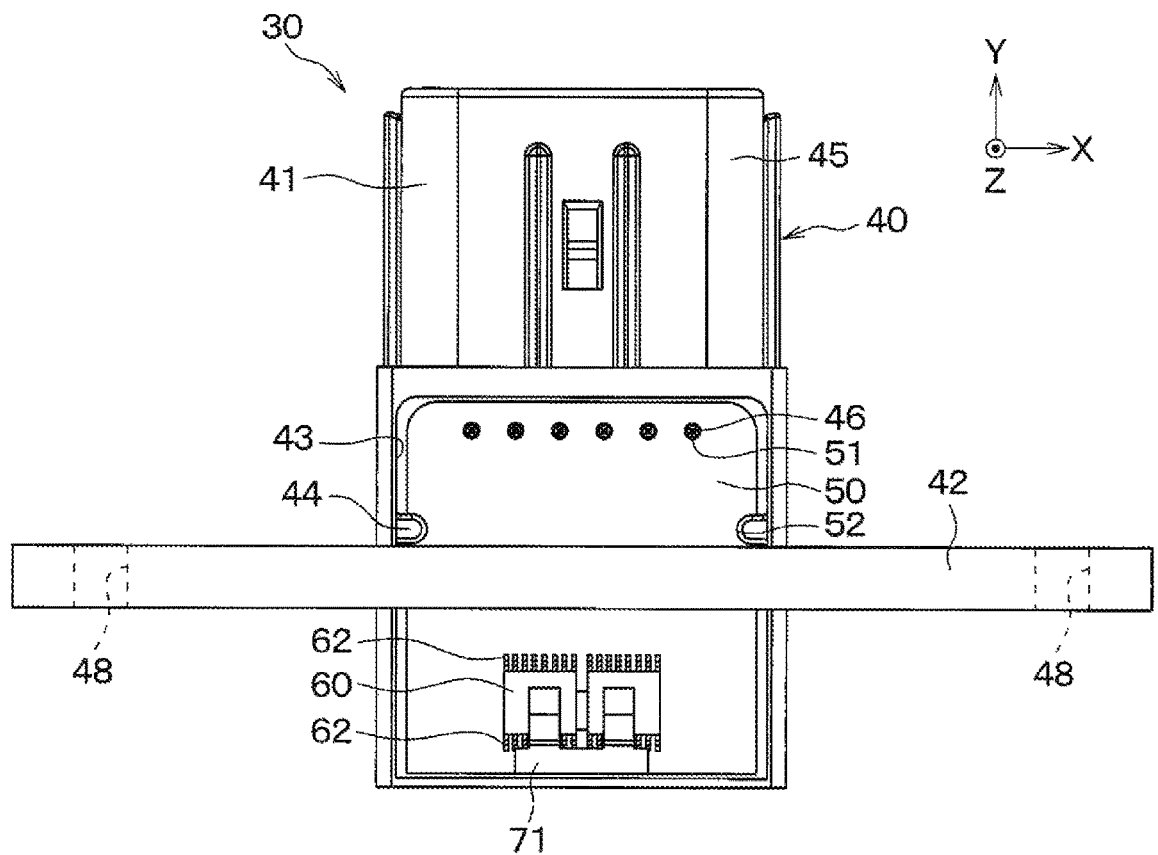
FIG. 14 is a front view of a magnetic sensor in a modification of the first embodiment.

For example, as shown in FIG. 14, the flange 42 may be installed to the base body 41 such that a portion of the flange 42 is placed at a location of the base body 41 where the circuit board 50 is placed. In such a magnetic sensor 30, the flange 42 may be installed to the base body 41 after the circuit board 50 is installed to the receiving recess 43.

In the first embodiment, there is described the case where the total number of magnetic poles of the multipole magnet 20 is 16. However, the total number of magnetic poles of the multipole magnet 20 may be appropriately changed. For example, the total number of magnetic poles of the multipole magnet 20 may be set to 20.

Figure 15:
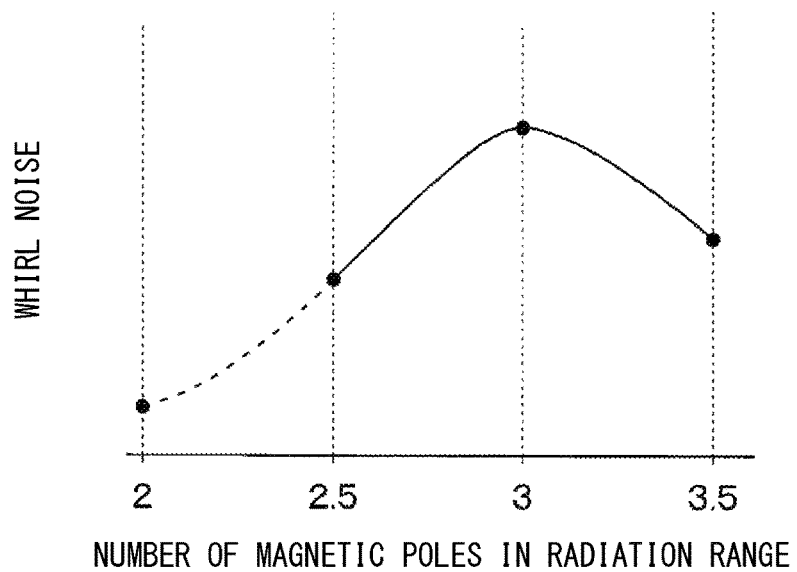
FIG. 15 is a diagram indicating a result of a simulation in a modification of the first embodiment with respect a relationship between the number of magnetic poles of the multipole magnet in a magnetic flux radiation range and a whirl noise in a case where the total number of the magnetic poles of the multipole magnet is twenty.

In such a case, as shown in FIG. 15, under the premise that the magnetic sensing devices 60, which have the same size as those of the first embodiment, is used, it becomes difficult to have the required configuration of the first and second magnetic flux guide members 71, 72 when the number of magnetic poles in the radiation range becomes equal to or smaller than 2.5. However, in a case where the magnetic sensing devices 60 having a smaller size are used, the whirl noise can be reduced when the number of magnetic poles in the radiation range is in the range of 2.0 to 2.5 as indicated by a dotted line in FIG. 15 like in the case where the number of magnetic poles is 16. Therefore, even when the total number of magnetic poles of the multipole magnet 20 is changed in the above described manner, the whirl noise can be reduced when the number of magnetic poles in the radiation range approaches 2.0.

Second Embodiment

A second embodiment will be described. The second embodiment differs from the first embodiment with respect to that a rack-type electric power steering apparatus 1 is provided. The rest of the present embodiment is the same as that of the first embodiment and will not be described here.

Figure 16:
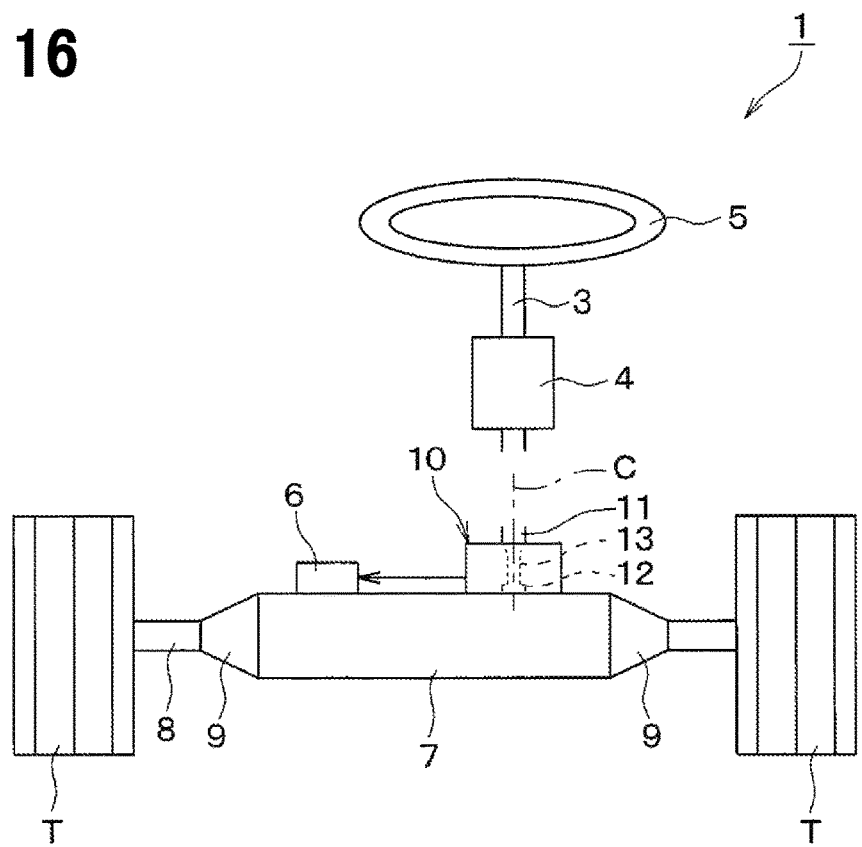
FIG. 16 is a schematic diagram indicating a structure of an electric power steering apparatus having a torque sensing device according to a second embodiment.

As shown in FIG. 16, the rack-type electric power steering apparatus 1 of the present embodiment includes a steering shaft 3, a steering column 4 and the steering wheel 5. Furthermore, the rack-type electric power steering apparatus 1 includes the electric motor 6, the steering gear mechanism 7, the link mechanisms 8, two rubber boots 9 and the torque sensing device 10. Although the steering shaft 3, the steering column 4 and the rubber boots 9 are also provided at the column-type electric power steering apparatus 1 shown in FIG. 1, the indication of these components along with the reference signs is omitted in FIG. 1 for the sake of simplicity.

The steering shaft 3 is rotatably supported by the steering column 4. One end portion of the steering shaft 3 is coupled to the steering wheel 5 and is rotated in response to the operation of the steering wheel 5.

The electric motor 6 is operated according to the operational state of the steering wheel 5 and provides an assist force for assisting the steering force for changing the orientation of the wheels T to the steering gear mechanism 7. As shown in FIG. 16, in the rack-type electric power steering apparatus 1, the electric motor 6 is installed to a casing of the steering gear mechanism 7. As described above, in the column-type electric power steering apparatus 1 shown in FIG. 1, the electric motor 6 is installed to the steering column 4.

The rubber boots 9 are respectively installed to two opposite end portions of the steering gear mechanism 7 which are respectively connected to the link mechanisms 8. The rubber boots 9 are provided to limit intrusion of the water into the inside of the steering gear mechanism 7 through connections of the steering gear mechanism 7 which are respectively connected to the link mechanisms 8.

In the rack-type electric power steering apparatus 1, the torque sensing device 10 is installed to the casing of the steering gear mechanism 7. In the column-type electric power steering apparatus 1 shown in FIG. 1, the torque sensing device 10 is installed to the steering column 4. Specifically, in the column-type electric power steering apparatus 1 shown in FIG. 1, the receiving wall W is the wall material that forms the casing of the steering column 4. In contrast, in the rack-type electric power steering apparatus 1, the receiving wall W is the wall material that forms the casing of the steering gear mechanism 7.

In the rack-type electric power steering apparatus 1, the torque sensing device 10 is provided at the installation height that is substantially the same as the installation height of the rubber boots 9. Therefore, in the rack-type electric power steering apparatus 1, the torque sensing device 10 is more likely to be in an environment, which has a high risk of being exposed to the water, than the column-type electric power steering apparatus 1. Specifically, the water is likely to intrude from the outside into the inside of the receiving wall W through a location between the magnetic sensor 30 and the receiving wall W.

Figure 17:
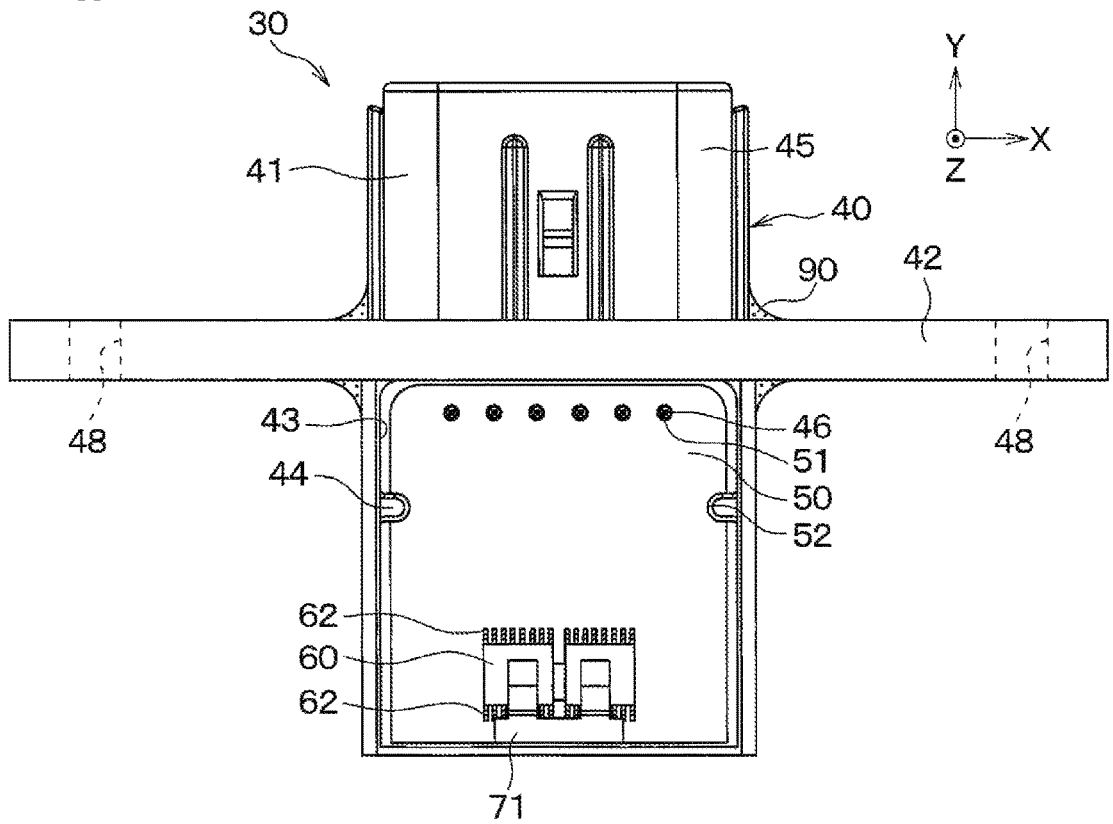
FIG. 17 is a front view of a magnetic sensor according to the second embodiment.

Therefore, in the present embodiment, as shown in FIG. 17, a sealing material 90, which is made of, for example, epoxy resin or the like, is placed at the location between the base body 41 and the flange 42. In this way, it is possible to limit the intrusion of the water into the inside of the receiving wall W through a gap between the base body 41 and the flange 42.

Figure 18:
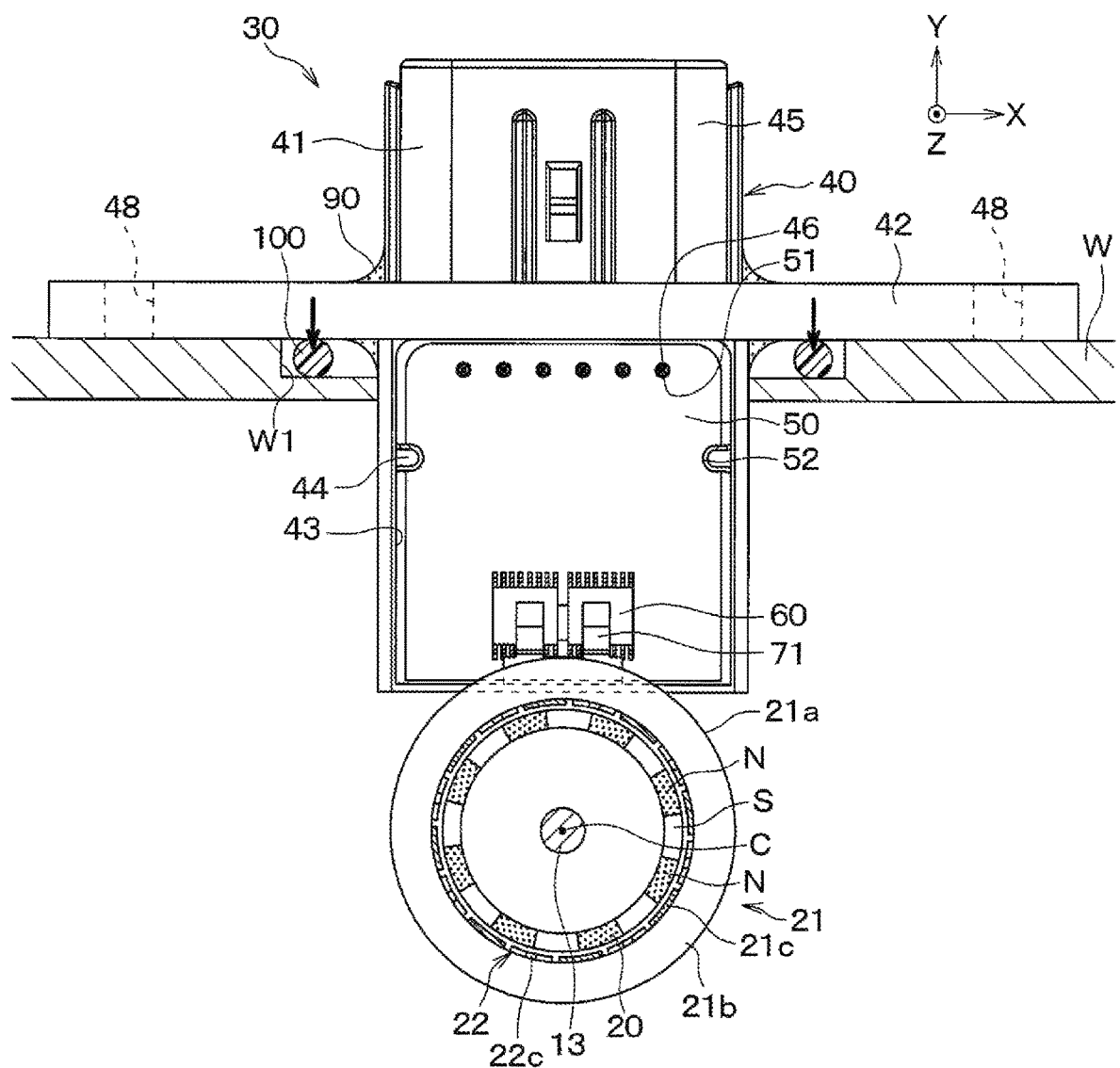
FIG. 18 is a schematic diagram of the torque sensing device where the magnetic sensor is installed to the receiving wall according to the second embodiment.

The structure of the magnetic sensor 30 of the present embodiment has been described. With reference to FIG. 18, when the magnetic sensor 30, which is constructed in the above-described manner, is installed to the receiving wall W, an O-ring 100, which serves as a sealing material, is installed to the receiving wall W in a sealing state, as indicated by arrows in FIG. 18. Specifically, in the present embodiment, the receiving wall W has the installation hole W1 to enable sealing of the O-ring 100. In this way, the sealing performance for sealing between the magnetic sensor 30 and the receiving wall W can be improved. In FIG. 18, the receiving wall W and the O-ring 100 are shown as a cross-sectional view for easy understanding.

As described above, the structure of the first embodiment can be applied to the rack-type electric power steering apparatus 1. In the present embodiment, the sealing material 90 is placed between the base body 41 and the flange 42. Therefore, it is possible to limit the intrusion of the water into the inside of the receiving wall W through the gap between the base body 41 and the flange 42.

In the present embodiment, the O-ring 100 is placed between the magnetic sensor 30 and the receiving wall W. Therefore, it is also possible to limit the intrusion of the water through the gap between the magnetic sensor 30 and the receiving wall W.

Third Embodiment

A third embodiment will be described. The present embodiment is a modification of the first embodiment in which the structure of the first and second magnetic flux guide members 71, 72 is changed. The rest of the present embodiment is the same as that of the first embodiment and will not be described here.

Figure 19:
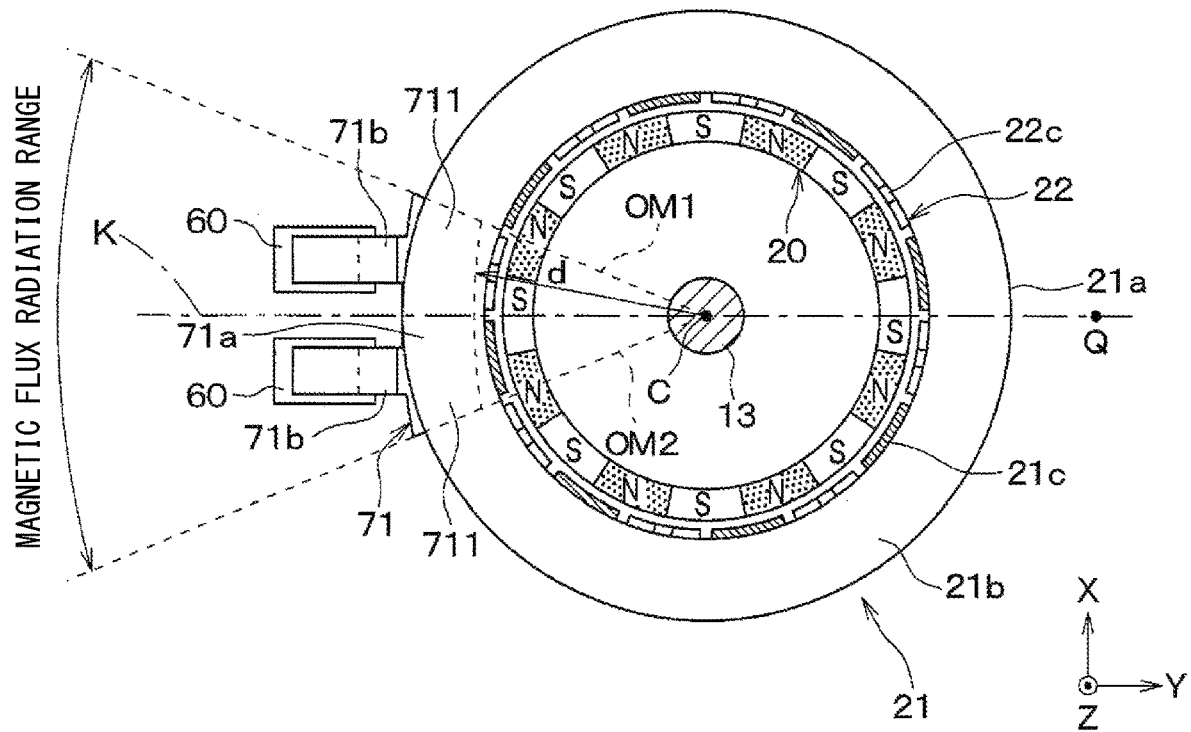
FIG. 19 is a diagram indicating a positional relationship between a first magnetic flux guide member and a first magnetic circuit portion according to a third embodiment.

In the present embodiment, as shown in FIG. 19, when the torque sensing device 10 is formed by using the magnetic sensor 30, the main body 71a of the first magnetic flux guide member 71 is shaped in an arcuate strip form that has two concentric arcuate edges which are radially opposed to each other and are arranged symmetrically with respect to the reference line K in the axial view. Specifically, the main body 71a is shaped in the arcuate strip form that has the two concentric arcuate edges that have a center of curvature at a point Q and have a curvature smaller than that of an arc centered on the rotational axis C while the point Q is located on an opposite side of the rotational axis C, which is opposite to the magnetic sensing devices 60, along the reference line K.

Although not depicted in a drawing, the second magnetic flux guide member 72 has a shape that is substantially the same as that of the first magnetic flux guide member 71.

As described above, even when the main bodies 71a, 72a are shaped in the arcuate strip form, advantages, which are similar to those of the first embodiment, can be achieved. The first embodiment, in which the radially inner edge of the main body 71a, 72a of each of the first and second magnetic flux guide members 71, 72 is a straight edge, can also be interpreted as a special form in which the point Q of the present embodiment exists at infinity and the curvature of the arc is infinitesimal.

Fourth Embodiment

A fourth embodiment will be described. The present embodiment is a modification of the first embodiment in which the structure of the first and second magnetic flux guide members 71, 72 is changed. The rest of the present embodiment is the same as that of the first embodiment and will not be described here.

Figure 20:
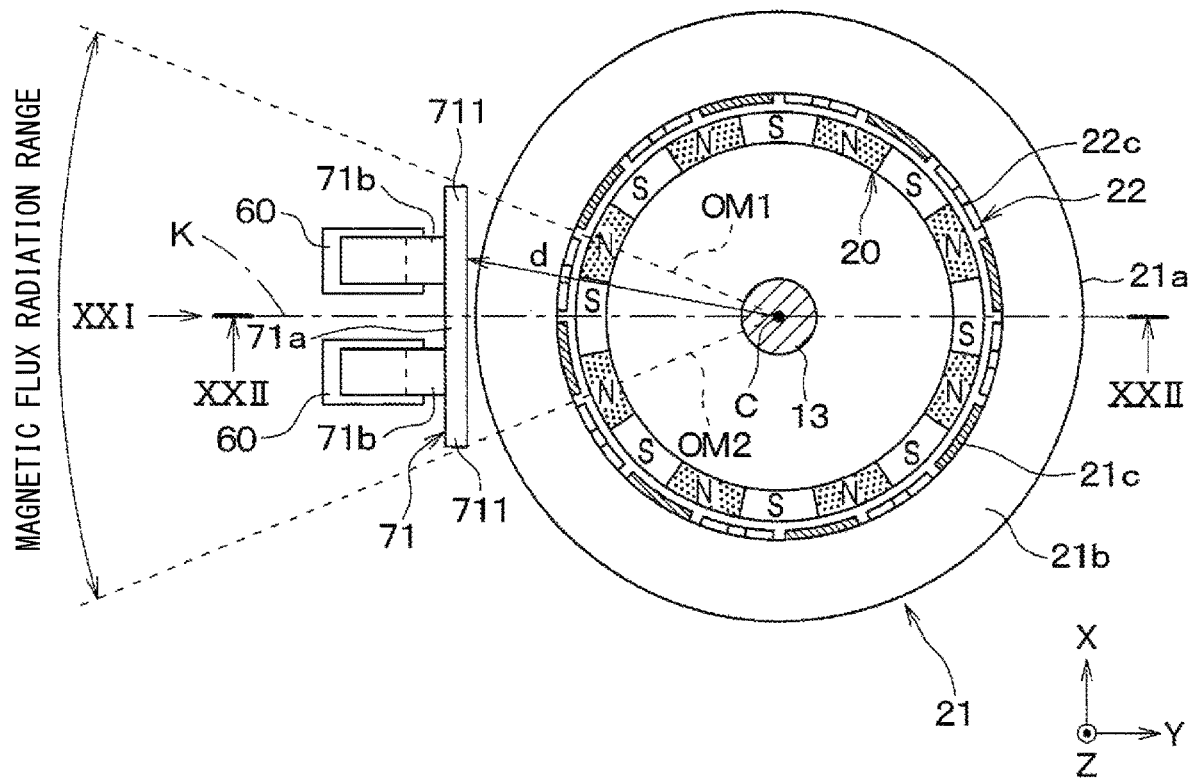
FIG. 20 is a diagram indicating a positional relationship between a first magnetic flux guide member and a first magnetic circuit portion according to a fourth embodiment.
Figure 21:
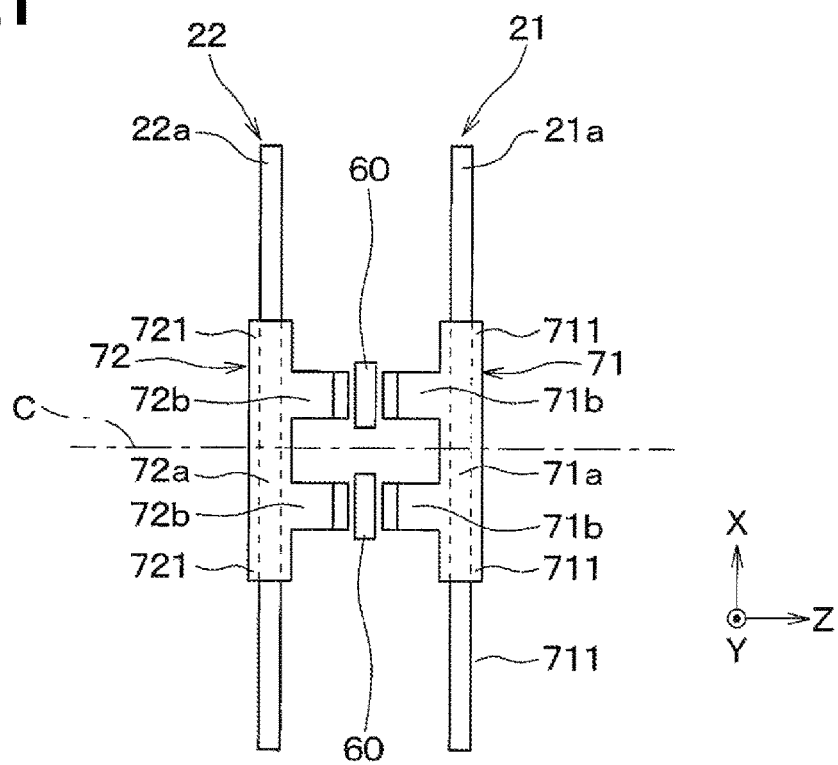
FIG. 21 is a plan view seen in a direction XXI in FIG. 20.
Figure 22:
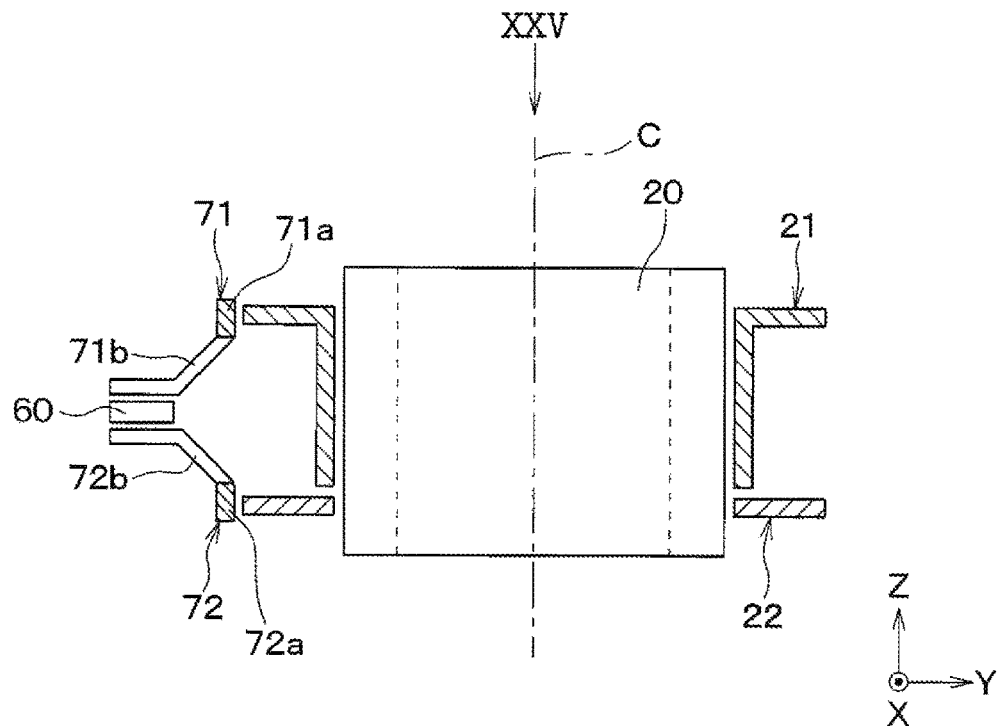
FIG. 22 is a cross-sectional view taken along line XXII-XXII in FIG. 20.

In the present embodiment, as shown in FIGS. 20 to 22, when the torque sensing device 10 is formed by using the magnetic sensor 30, the first and second magnetic flux guide members 71, 72 are arranged as follows. Specifically, each of the first and second magnetic flux guide members 71, 72 is arranged such that in the axial view, the main body 71a, 72a is located on the radially outer side of the outer peripheral edge of each of the first and second magnetic circuit portions 21, 22. More specifically, the first and second magnetic flux guide members 71, 72 are respectively opposed to the outer peripheral surfaces of the first and second ring plates 21b, 22b in the radial direction.

As described above, even when the first and second magnetic flux guide members 71, 72 are placed on the radially outer side of the first and second magnetic circuit portions 21, 22, advantages, which are similar to those of the first embodiment, can be achieved.

Fifth Embodiment

A fifth embodiment will be described. The present embodiment is a modification of the first embodiment in which the structure of the first and second magnetic flux guide members 71, 72 is changed. The rest of the present embodiment is the same as that of the first embodiment and will not be described here.

Figure 23:
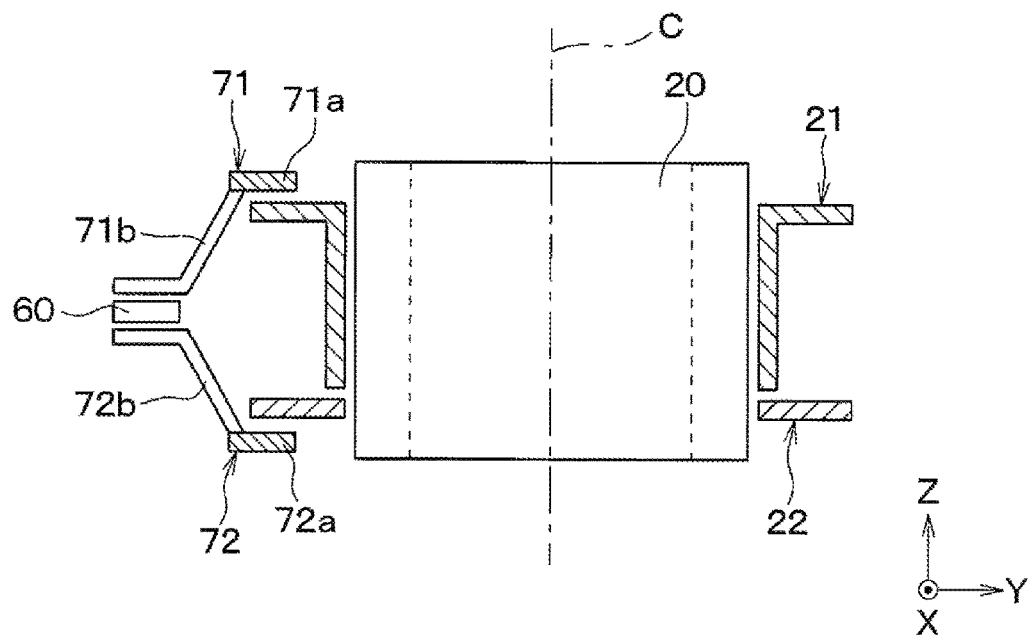
FIG. 23 is a diagram indicating a positional relationship between first and second magnetic flux guide members and first and second magnetic circuit portions according to a fifth embodiment.

In the present embodiment, as shown in FIG. 23, when the torque sensing device 10 is formed by using the magnetic sensor 30, the main bodies 71a, 72a of the first and second magnetic flux guide members 71, 72 are respectively placed on an outer side of the first and second magnetic circuit portions 21, 22 in the axial direction. Specifically, the main body 71a, 72a of each of the first and second magnetic flux guide members 71, 72 is opposed to an annular surface of the corresponding one of the first and second ring plates 21b, 22b of the first and second magnetic circuit portions 21, 22 on the inner side of the corresponding one of the first and second ring plates 21b, 22b in the axial direction. In other words, each of the first and second magnetic flux guide members 71, 72 is arranged such that the main body 71a, 72a is opposed to the corresponding one of the first and second magnetic circuit portions 21, 22 on the inner side of the corresponding one of the first and second magnetic circuit portions 21, 22 in the axial direction.

As described above, even when each of the first and second magnetic flux guide members 71, 72 is placed on the axially outer side of the corresponding one of the first and second magnetic circuit portions 21, 22, advantages, which are similar to those of the first embodiment, can be achieved. Each of the first and second magnetic flux guide members 71, 72 may be shaped in the arcuate strip form that has two concentric arcuate edges which are radially opposed to each other like in the third embodiment.

(Modification of Fifth Embodiment)

Figure 24:
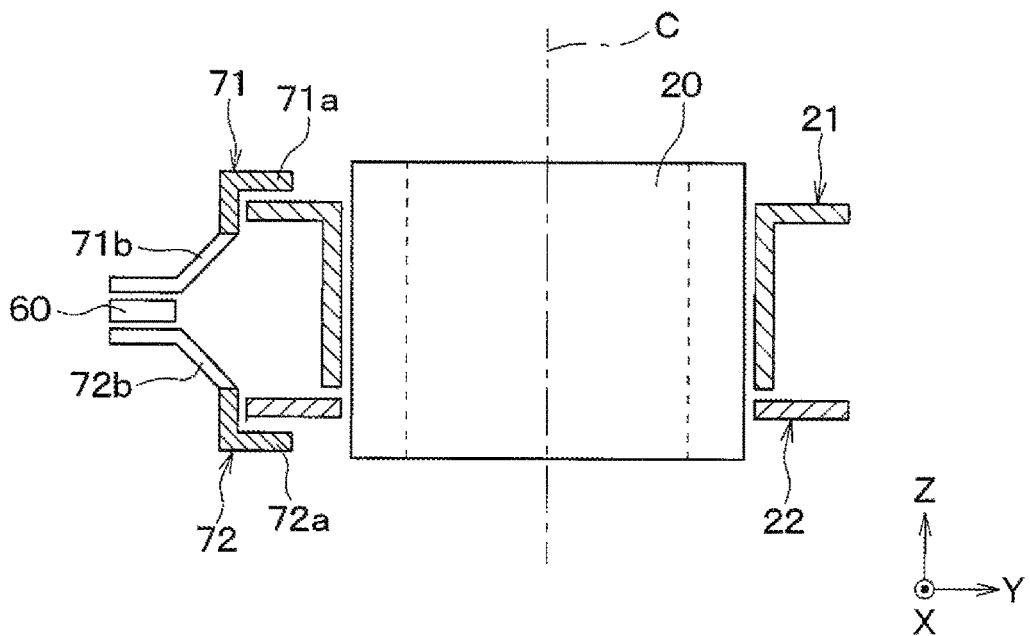
FIG. 24 is a diagram indicating a positional relationship between first and second magnetic flux guide members and first and second magnetic circuit portions in a modification of the fifth embodiment.

A modification of the fifth embodiment will now be described. In the fifth embodiment, as shown in FIG. 24, each of the first and second magnetic flux guide members 71, 72 may be shaped to oppose the annular surface and the outer peripheral surface of the corresponding one of the first and second ring plates 21b, 22b of the first and second magnetic circuit portions 21, 22 on the axially outer side and the radially outer side of the corresponding one of the first and second ring plates 21b, 22b. In such a case, a cross-section of each of the main bodies 71a, 72a is shaped generally in an L-form to oppose the outer peripheral surface of the corresponding one of the first and second ring plates 21b, 22b besides the annular surface of the corresponding one of the first and second ring plates 21b, 22b.

Sixth Embodiment

A sixth embodiment will be described. The present embodiment is a modification of the first embodiment in which the structure of the first and second magnetic flux guide members 71, 72 is changed. The rest of the present embodiment is the same as that of the first embodiment and will not be described here.

Figure 25:
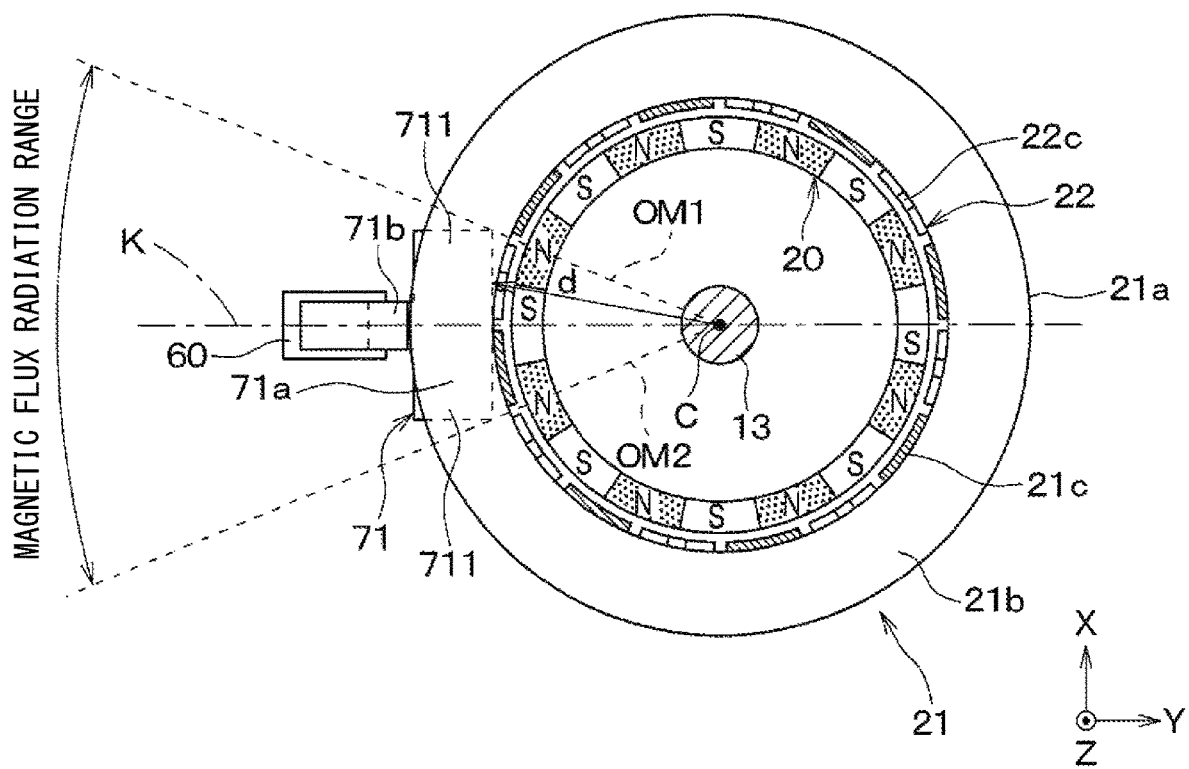
FIG. 25 is a diagram indicating a positional relationship between a first magnetic flux guide member and a first magnetic circuit portion according to a sixth embodiment.

First of all, in each of the above embodiments, the number of the magnetic sensing devices 60 is two. Alternatively, there may be provided only one magnetic sensing device 60. In such a case, as shown in FIG. 25, the first magnetic flux guide member 71 includes only one extension 71b. The second magnetic flux guide member 72 has a shape that is substantially the same as that of the first magnetic flux guide member 71. Furthermore, in this structure, the reference line K is an imaginary straight line that connects between the single magnetic sensing device 60 and the rotational axis C.

Advantages, which are similar to those of the first embodiment, can be achieved even with the above-described structure, in which the only one extension 71b is provided instead of the two extensions 71b, 72b, and the only one magnetic sensing device 60 is provided instead of the two magnetic sensing devices 60.

Seventh Embodiment

A seventh embodiment will be described. The present embodiment is a modification of the first embodiment in which the structure of the first and second magnetic flux guide members 71, 72 is changed. The rest of the present embodiment is the same as that of the first embodiment and will not be described here.

Figure 26:
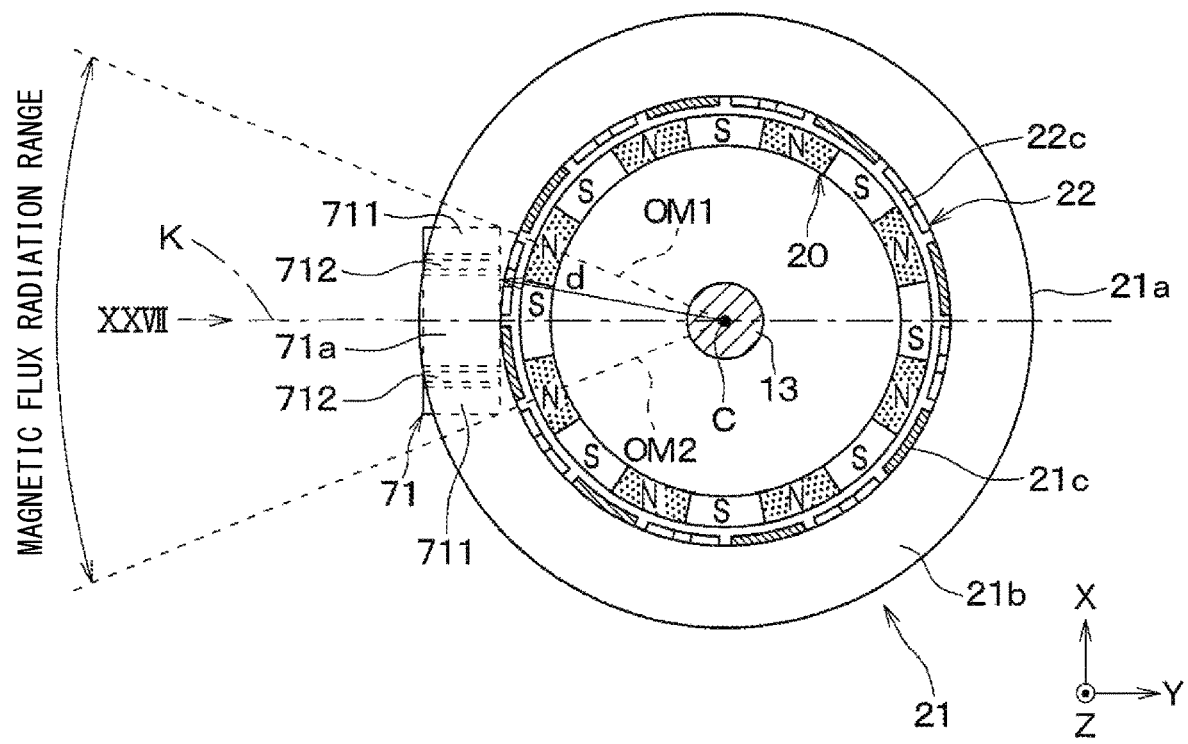
FIG. 26 is a diagram indicating a positional relationship between a first magnetic flux guide member and a first magnetic circuit portion according to a seventh embodiment.
Figure 27:
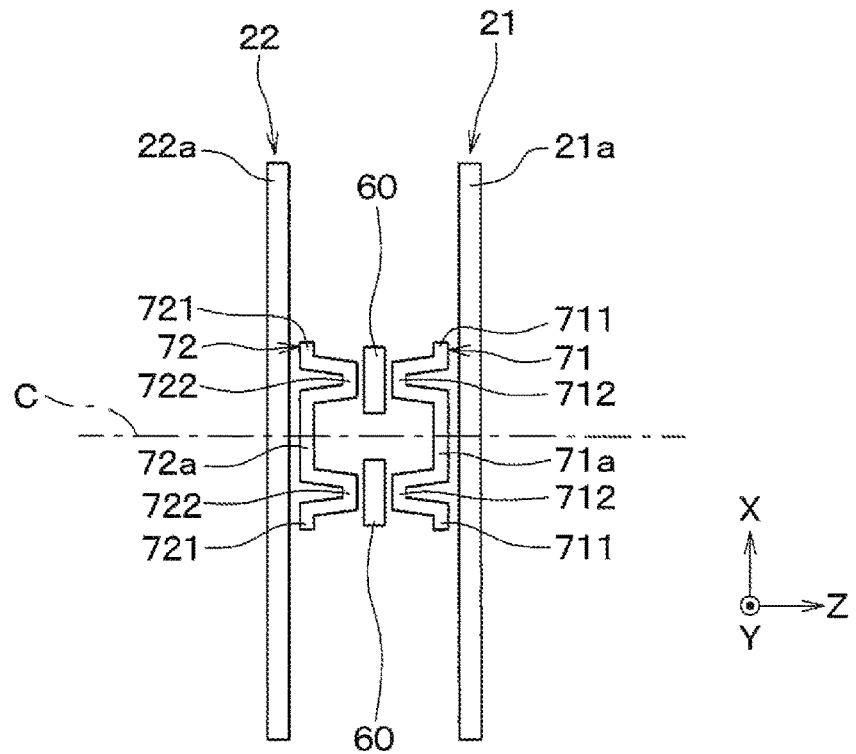
FIG. 27 is a plan view seen in a direction XXVII in FIG. 26.

In the present embodiment, as shown in FIGS. 26 and 27, each of the first and second magnetic flux guide members 71, 72 is formed only by the main body 71a, 72a shaped in the rectangular strip form and does not have the extensions 71b, 72b. Furthermore, each of the first and second magnetic flux guide members 71, 72 includes two bent portions 712, 722 that are formed by axially bending two portions of the main body 71a, 72a respectively opposed to the two magnetic sensing devices 60. Specifically, each of the first and second magnetic flux guide members 71, 72 includes the bent portions 712, 722 that are formed by axially bending the two portions of the main body 71a, 72a toward the main body 71a, 72a of the other one of the first and second magnetic flux guide members 71, 72.

In the present embodiment, the bent portions 722 of the second magnetic flux guide member 72 are placed in the opening 53.

Advantages, which are similar to those of the first embodiment, can be achieved even when the bent portions 712, 722 are formed at the main bodies 71a, 72a.

Other Embodiments

Although the present disclosure has been described with reference to the embodiments, the present disclosure should not be limited to those embodiments and the structure described in those embodiments. The present disclosure includes modifications and variations within an equivalent range. In addition, various combinations and forms, as well as other combinations and forms that include only one element, more, or less of the above-described embodiments and modifications, are also within the scope of the present disclosure.

For example, in each of the above embodiments, each direction is set for convenience of explanation of the embodiment. Thus, the axial direction of the rotational axis C is a direction that intersects the vehicle height direction in many cases.

Furthermore, in each of the above embodiments, in which the main body 71a, 72a of each of the first and second magnetic flux guide members 71, 72 is shaped in the rectangular strip form, it is only required that the main body 71a, 72a is shaped generally in the rectangular strip form. Furthermore, in each of the above embodiments, in which the main body 71a, 72a of each of the first and second magnetic flux guide members 71, 72 is shaped in the arcuate strip form, it is only required that the main body 71a, 72a is shaped generally in the arcuate strip form.

Furthermore, in each of the above embodiments, the main body 71a, 72a of each of the first and second magnetic flux guide members 71, 72 may not be formed such that the number of magnetic poles in the radiation range is in the range of 1.2 to 2.8. Even with this configuration, the material, which forms the first and second magnetic flux guide members 71, 72, can be reduced in comparison to the case where the main body 71a, 72a of each of the first and second magnetic flux guide members 71, 72 is shaped in the annular form.

Furthermore, in each of the above embodiments, the circuit board 50 may be arranged such that the one surface 50a of the circuit board 50 is opposed to the bottom surface of the receiving recess 43. A portion of the first magnetic flux guide member 71 may be installed from the other surface 50b side into the opening 53 of the circuit board 50.

Furthermore, in each of the above embodiments, the shape of the opening 53 of the circuit board 50 may be appropriately changed to another form. For example, the opening 53 may be formed such that a portion of the opening 53 extends to reach an outer peripheral edge of the circuit board 50.

Furthermore, in each of the above embodiments, the flange 42 may be made of another material, which is other than the metal material, as long as the material of the flange 42 has the higher rigidity than the base body 41.

Furthermore, in each of the first and second embodiments, the shape of each of the first and second magnetic flux guide members 71, 72 may be appropriately changed as long as one of the first and second magnetic flux guide members 71, 72 is placed in the opening 53 of the circuit board 50. For example, each of the first and second magnetic flux guide members 71, 72 may have a portion, which is shaped in a ring form that surrounds the corresponding one of the first and second magnetic circuit portions 21, 22.

Furthermore, in each of the above embodiments, the circuit board 50 may not be installed to the sensor housing 40, and the magnetic sensing device 60 may be installed directly to the sensor housing 40. Furthermore, in each of the above embodiments, the circuit board 50 may not have the opening 53.

Furthermore, the torque sensing device 10 of each of the above embodiments may be applied not only to the electric power steering apparatus 1 but also to various devices for detecting a shaft torque.

Furthermore, the above embodiments may be combined in any appropriate manner. For example, the following combination may be implemented in the case where the torque sensing device 10 is constructed. Specifically, any one or more of the third to seventh embodiments may be appropriately combined with the second embodiment such that the shapes of the first and second magnetic flux guide members 71, 72 and the positional relationship between the first and second magnetic flux guide members 71, 72 and the first and second magnetic circuit portions 21, 22 are changed.

Furthermore, any one or more of the combinations of the above embodiments may be combined with another one or more of the combinations of the above embodiments.

What is claimed is:

1. A magnetic sensor configured to output an electrical signal corresponding to a magnetic flux generated between a first magnetic circuit portion and a second magnetic circuit portion which are opposed to each other, the magnetic sensor comprising:
   a magnetic sensing device that is configured to output the electrical signal which corresponds to the magnetic flux;
   a sensor housing that includes:
      a base body which holds the magnetic sensing device at one end portion of the base body, wherein the one end portion of the base body is configured to face the first magnetic circuit portion and the second magnetic circuit portion; and
      a flange which is fixed to the base body and is configured to be placed in contact with a receiving wall that receives the first magnetic circuit portion and the second magnetic circuit portion; and
   a pair of magnetic flux guide members that are respectively made of a soft magnetic material and are configured to guide the magnetic flux to the magnetic sensing device, wherein the pair of magnetic flux guide members are opposed to each other while the magnetic sensing device is interposed between the pair of magnetic flux guide members, wherein:
   the flange is made of a material having a higher rigidity than the base body; and
   the pair of magnetic flux guide members are held by the base body together with the magnetic sensing device.

2. The magnetic sensor according to claim 1, comprising a circuit board on which the magnetic sensing device is installed; and
   the circuit board is fixed to the base body, so that the magnetic sensing device is held by the base body.

3. The magnetic sensor according to claim 2, wherein:
   the circuit board has an opening;
   the magnetic sensing device is arranged to overlap the opening in a normal direction that is perpendicular to a plane of the circuit board; and
   one of the pair of magnetic flux guide members is placed in the opening.

4. The magnetic sensor according to claim 1, wherein a sealing material is placed between the flange and the base body.

5. The magnetic sensor according to claim 1, wherein a waterproof covering material, which integrally covers the magnetic sensing device and the pair of magnetic flux guide members, is arranged at the base body.

6. The magnetic sensor according to claim 1, wherein the flange is made of a metal material.

7. The magnetic sensor according to claim 6, wherein the flange is made of iron or an iron-based alloy.

8. A torque sensing device configured to output an electrical signal that corresponds to a torsional torque generated at a torsion bar in response to relative rotation about a rotational axis between a first shaft and a second shaft which are coaxially coupled through the torsion bar along the rotational axis, the torque sensing device comprising:
   the magnetic sensor of claim 1;
   the first magnetic circuit portion that is placed at one side of a multipole magnet in an axial direction of the rotational axis, wherein the multipole magnet has a plurality of magnetic poles which are arranged in a circumferential direction about the rotational axis such that polarities of the plurality of magnetic poles are alternately changed in the circumferential direction, and the multipole magnet is placed coaxially with the torsion bar such that the multipole magnet is rotated about the rotational axis in response to the relative rotation; and the second magnetic circuit portion that is placed at another side of the multipole magnet in the axial direction, wherein:

the magnetic sensor is placed such that the pair of magnetic flux guide members are magnetically coupled to a magnetic circuit that is formed by the first magnetic circuit portion and the second magnetic circuit portion;

the pair of magnetic flux guide members include a first magnetic flux guide member, which has a main body opposed to the first magnetic circuit portion, and a second magnetic flux guide member, which has a main body opposed to the second magnetic circuit portion; and each of the main body of the first magnetic flux guide member and the main body of the second magnetic flux guide member is configured as follows:

the main body has a pair of outer end portions that are respectively placed on one circumferential side and another circumferential side of a reference line which is an imaginary line being perpendicular to the rotational axis and intersecting the main body;

a distance measured between the rotational axis and the main body is set such that the distance measured at each of the pair of outer end portions is longer than the distance measured at an intermediate portion of the main body circumferentially located between the pair of outer end portions; and one or more of the plurality of magnetic poles of the multipole magnet is placed in a magnetic flux radiation range of the first shaft that is a circumferential range defined between two imaginary lines while a number of the one or more of the plurality of magnetic poles of the multipole magnet is within a predetermined range, wherein one of the two imaginary lines radially connects a radially inner side part of one of the pair of outer end portions to the rotational axis, and another one of the two imaginary lines radially connects a radially inner side part of another one of the pair of outer end portions to the rotational axis.

9. The torque sensing device according to claim 8, wherein each of the main body of the first magnetic flux guide member and the main body of the second magnetic flux guide member is configured such that the number of the one or more of the plurality of multipole magnet included in the magnetic flux radiation range is in a range of 1.2 to 2.8.

10. A steering apparatus to be installed to a vehicle, comprising:

the torque sensing device of claim 8; and an electric motor that is configured to output a drive force for assisting an operation of a maneuvering device operated by an occupant of the vehicle based on the electrical signal outputted from the torque sensing device.

* * * * *